United States Patent
Hase et al.

(10) Patent No.: US 7,907,852 B2
(45) Date of Patent: Mar. 15, 2011

(54) OPTICAL TRANSMITTER CIRCUIT

(75) Inventors: Kazutoshi Hase, Osaka (JP); Hiroyuki Sasai, Osaka (JP); Tomoaki Ieda, Osaka (JP)

(73) Assignee: Panasonic Corporation, Osaka (JP)

( * ) Notice: Subject to any disclaimer, the term of this patent is extended or adjusted under 35 U.S.C. 154(b) by 977 days.

(21) Appl. No.: 11/657,105

(22) Filed: Jan. 24, 2007

(65) Prior Publication Data

US 2007/0171946 A1 Jul. 26, 2007

(30) Foreign Application Priority Data

Jan. 25, 2006 (JP) ................................ 2006-016304
Feb. 22, 2006 (JP) ................................ 2006-044759
Aug. 1, 2006 (JP) ................................ 2006-209655

(51) Int. Cl.
*H04B 10/20* (2006.01)

(52) U.S. Cl. ...... 398/197; 398/193; 398/199; 372/38.02; 315/224; 315/247

(58) Field of Classification Search .................. 398/186, 398/187, 188, 189, 193, 197, 182, 199; 372/29.02
See application file for complete search history.

(56) References Cited

U.S. PATENT DOCUMENTS

| | | | | |
|---|---|---|---|---|
| 5,402,433 A | * | 3/1995 | Stiscia | 372/31 |
| 5,675,609 A | * | 10/1997 | Johnson | 375/237 |
| 6,049,175 A | * | 4/2000 | Forsberg | 315/200 A |
| 6,285,692 B1 | * | 9/2001 | Okayasu | 372/38.02 |
| 6,597,209 B2 | * | 7/2003 | Iguchi et al. | 327/108 |
| 7,612,505 B2 | * | 11/2009 | Min et al. | 315/291 |
| 7,668,464 B2 | * | 2/2010 | Giaretta et al. | 398/135 |
| 2002/0175636 A1 | * | 11/2002 | Kawasaka et al. | 315/224 |
| 2002/0181520 A1 | * | 12/2002 | Iguchi et al. | 372/38.02 |
| 2003/0104793 A1 | * | 6/2003 | Iwasaki | 455/117 |
| 2004/0131362 A1 | * | 7/2004 | Giaretta et al. | 398/135 |
| 2007/0171946 A1 | * | 7/2007 | Hase et al. | 372/29.02 |
| 2010/0166436 A1 | * | 7/2010 | Hase et al. | 398/182 |

FOREIGN PATENT DOCUMENTS

JP 05-121783 5/1993
JP 2002-064433 2/2002

* cited by examiner

*Primary Examiner* — Ken N Vanderpuye
*Assistant Examiner* — Danny W Leung
(74) *Attorney, Agent, or Firm* — Wenderoth, Lind & Ponack, L.L.P.

(57) ABSTRACT

A first peaking current generating section generates a first peaking current in synchronism with the transitions of a digital signal, being positive at the rising edge and negative at the falling edge. A second peaking current generating section generates a second peaking current in synchronism with the transitions of the digital signal, being negative at the rising edge and positive at the falling edge. A first light emitting element driving section produces a first driving current obtained by combining together a signal amplitude current according to the amplitude of the digital signal and a first peaking current. A second light emitting element driving section produces a second driving current obtained by combining together the signal amplitude current according to the amplitude of the digital signal and a second peaking current. Then, the first and second light emitting element driving sections and drive the light emitting element by using a driving current obtained by subtracting the first driving current from the second driving current.

12 Claims, 22 Drawing Sheets

OPTICAL TRANSMITTER CIRCUIT

BACKGROUND OF THE INVENTION

1. Field of the Invention

The present invention relates to an optical transmitter circuit, for use in the field of optical communications, including a circuit capable of driving a light emitting element at a high speed.

2. Description of the Background Art

A commonly known type of a driving circuit for driving, at a high speed, a light emitting element (e.g., an LED) whose response speed is relatively slow employs a peaking technique. With the peaking technique, an instantaneous current (hereinafter referred to as a "peaking current") is given to a light emitting element so as to force the light emitting element to respond at a high speed. FIG. 20 shows an exemplary configuration of a common conventional light emitting element driving circuit using a peaking technique. FIG. 21 shows waveform diagrams illustrating an operation of the conventional light emitting element driving circuit shown in FIG. 20.

The conventional light emitting element driving circuit shown in FIG. 20 includes a light emitting element 101, a peaking current generating section 102, and a light emitting element driving section 103. A digital signal S (the waveform (a) of FIG. 21) is inputted to the light emitting element driving section 103. The peaking current generating section 102 generates a spire-shaped peaking current P (the waveform (b) of FIG. 21) at the rising and falling edges of the digital signal S. The light emitting element driving section 103 receives the digital signal S and the peaking current P, and outputs a driving current D (the waveform (c) of FIG. 21) whose waveform is obtained by combining together an amplitude current according to the amplitude of the digital signal S and the peaking current P. The light emitting element 101 receives the driving current D, and outputs an optical signal (the waveform (d) of FIG. 21) whose waveform substantially matches that of the digital signal S. This is how it is possible to realize a high speed response of the light emitting element 101.

However, the response speed that can be realized with the conventional light emitting element driving circuit described above is on the order of Mbps at best. Realizing a response speed on the order of 100 Mbps or more requires the use of a very large peaking current P, which causes clipping at the falling edge in the light emitting element driving section 103. Therefore, the light emitting element 101 cannot be operated at a high speed. A possible solution to this problem is to increase the DC current through the light emitting element driving section 103 so as to prevent the clipping at the falling edge. However, the solution has problems such as an increase in the power consumption, and deterioration in the extinction ratio, which is the ratio between the high level and the low level of the digital signal. In worst cases, the guaranteed range may be exceeded, and the light emitting element 101 may break down.

A technique for solving such a problem is proposed in a patent document (Japanese Laid-Open Patent Publication No. 2002-64433, FIG. 1), etc. FIG. 22 shows an exemplary configuration of the conventional light emitting element driving circuit disclosed in this patent document. FIG. 23 shows waveform diagrams illustrating an operation of the conventional light emitting element driving circuit shown in FIG. 22.

As compared with the conventional light emitting element driving circuit shown in FIG. 20, the conventional light emitting element driving circuit shown in FIG. 22 further includes a discharge circuit 104 for pulling a portion of the driving current D flowing into the light emitting element 101. The peaking current generating section 102 generates a large peaking current P (the waveform (b) of FIG. 23). The light emitting element driving section 103 receives the digital signal S (the waveform (a) of FIG. 23) and the peaking current, and outputs the driving current D (the waveform (c) of FIG. 23) whose waveform is obtained by combining together an amplitude current of the digital signal S and the peaking current P, i.e., whose waveform is such that the amount of clipping at the falling edge is reduced as much as possible. The light emitting element 101 receives a current D' (the waveform (d) of FIG. 23), which is the remainder after pulling a current from the driving current D by the discharge circuit 104, and outputs an optical signal (the waveform (e) of FIG. 23). With this configuration, it is possible to reduce the DC current flowing through the light emitting element 101 to improve the extinction ratio, and the light emitting element 101 can be operated with an amount of current within the guaranteed range.

However, with the conventional light emitting element driving circuit shown in FIG. 22, it is necessary to increase the driving current D of the light emitting element 101 by the amount of current to be pulled by the discharge circuit 104, thereby increasing the power consumption of the circuit.

It is necessary to increase the driving current D so as to prevent clipping, and it is necessary to provide a very large current, which makes the circuit scale impractically large.

Moreover, instances of clipping include those occurring at a transistor of the light emitting element driving section 103 and those occurring at the light emitting element 101. With the conventional light emitting element driving circuit, it is possible to improve those occurring at the light emitting element 101 but not those occurring at a transistor. Therefore, the falling edge in the waveform of the optical output of the light emitting element 101 becomes deteriorated, as shown in the waveform (e) of FIG. 23.

SUMMARY OF THE INVENTION

Therefore, an object of the present invention is to provide an optical transmitter circuit which is capable of driving a light emitting element at a high speed with a desirable extinction ratio and a low power consumption, and without waveform deterioration of the optical output.

The present invention is directed to an optical transmitter circuit for driving a light emitting element according to a received digital signal. In order to achieve the object set forth above, the optical transmitter circuit of the present invention includes first and second peaking current generating sections, and first and second light emitting element driving sections. The first peaking current generating section generates a first peaking current in synchronism with a rising edge of the digital signal. The second peaking current generating section generates a second peaking current in synchronism with a falling edge of the digital signal. The first light emitting element driving section produces a first driving current obtained by combining together a signal amplitude current according to an amplitude of the digital signal and the first peaking current. The second light emitting element driving section produces a second driving current obtained by combining together the signal amplitude current according to the amplitude of the digital signal and second peaking current. The first and second light emitting element driving sections drive the light emitting element by using a current obtained by subtracting the first driving current from the second driving current.

Preferably, the first light emitting element driving section adjusts the signal amplitude current so that the driving current does not have a peaking current in synchronism with the falling edge of the digital signal, and the second light emitting element driving section adjusts the signal amplitude current so that the driving current does not have a peaking current in synchronism with the rising edge of the digital signal.

The optical transmitter circuit may further include a DC current supply section for supplying a DC current to the light emitting element, or a third light emitting element driving section for supplying an amplitude current according to the amplitude of the digital signal directly to the light emitting element. In such a configuration, the first light emitting element driving section may output only the peaking current in synchronism with the rising edge to the light emitting element, and the second light emitting element driving section may output only the peaking current in synchronism with the falling edge to the light emitting element. In such a case, only the rising edge of the digital signal may be compensated for while omitting the second peaking current generating section and the second light emitting element driving section.

Typically, each of the first and second peaking current generating sections includes a first resistor and a second resistor connected in series with each other, and a capacitor connected in parallel to the first resistor. In the configuration, the first light emitting element driving section includes an NPN-type transistor, and the second light emitting element driving section includes a PNP-type transistor. The light emitting element may be provided within the optical transmitter circuit, and the light emitting element is preferably an LED.

In order to achieve the object set forth above, another optical transmitter circuit of the present invention includes a peaking current generating section, a light emitting element driving section, a signal analysis section, and a clipping section. The peaking current generating section generates a peaking current in synchronism with a rising edge and a falling edge of the digital signal. The light emitting element driving section produces a driving current obtained by combining together a signal amplitude current according to an amplitude of the digital signal and the peaking current, so as to drive the light emitting element by using the driving current. The signal analysis section analyzes the digital signal so as to set a control signal based on at least one of a pulse width and the amplitude of the digital signal. The clipping section clips the peaking current of the driving current according to the control signal set by the signal analysis section.

Preferably, the clipping section sets a ratio of a clipping current amount with respect to the peaking current amount to be less than or equal to a predetermined value. Preferably, the clipping section controls a bias current of the driving current produced by the light emitting element driving section.

Typically, the signal analysis section includes a pulse width detection section for detecting a pulse width of the digital signal, and a pulse width control section for setting a control signal according to the detected pulse width. Alternatively, the signal analysis section includes an amplitude detection section for detecting the amplitude of the digital signal, and an amplitude control section for setting a control signal according to the detected amplitude.

Alternatively, the signal analysis section may include the pulse width detection section, the pulse width control section, the amplitude detection section, the amplitude control section, and a process section for setting, as a control signal, a signal obtained by adding together the signal outputted from the pulse width control section and the signal outputted from the amplitude control section. With such a configuration, the signal analysis section may further include: a light receiving element for receiving an optical signal transmitted from a communication unit with which the optical transmitter circuit is communicating; an amplifier section for amplifying the signal received by the light receiving element; a signal detection section for detecting the amplitude of the signal amplified by the amplifier section; and an amplitude control section for controlling the amplitude of the digital signal inputted to the pulse width detection section based on a detection result of the signal detection section. Instead of using the amplitude control section, the peaking current generating section may be used to control an amount of peaking current to be generated based on a detection result of the signal detection section.

Specifically, the peaking current generating section includes a first resistor and a second resistor connected in series with each other, and a capacitor connected in parallel to the first resistor. Particularly, where the amount of peaking current to be generated is controlled based on the detection result of the signal detection section, it is preferred that the peaking current generating section includes a plurality of blocks, each block including a first resistor and a second resistor connected in series with each other, and a capacitor connected in parallel to the first resistor, and the blocks are switched from one to another based on a detection result of the signal detection section.

A predetermined value $a2/a1$, being a ratio of a clipping current amount $a2$ with respect to a peaking current amount $a1$, is preferably determined as shown in Expression 6 set forth below in the description of preferred embodiments. Particularly, the clipping section preferably determines the predetermined value $a2/a1$ so as to satisfy $0<a2/a1\leq 0.8$ in a case where the light emitting element is driven at a transmission speed of about 500 Mbps.

The light emitting element may be provided within the optical transmitter circuit, and the light emitting element is preferably an LED.

According to the present invention, a rising-edge peaking current and a falling-edge peaking current are supplied separately to thereby prevent a deterioration of the optical signal waveform outputted from the light emitting element, whereby the light emitting element can be driven with an intended rising speed and an intended falling speed. Moreover, it is not necessary to increase the DC current for preventing the clipping of the falling-edge peaking current, whereby it is possible to reduce the power consumption and improve the extinction ratio.

Moreover, in the present invention, the ratio of the clipping current with respect to the instantaneous driving current is set to be less than or equal to a predetermined value, whereby it is possible to realize a high-speed response of a light emitting element and to reduce the power consumption.

These and other objects, features, aspects and advantages of the present invention will become more apparent from the following detailed description of the present invention when taken in conjunction with the accompanying drawings.

DESCRIPTION OF THE INVENTION

Figure 1:
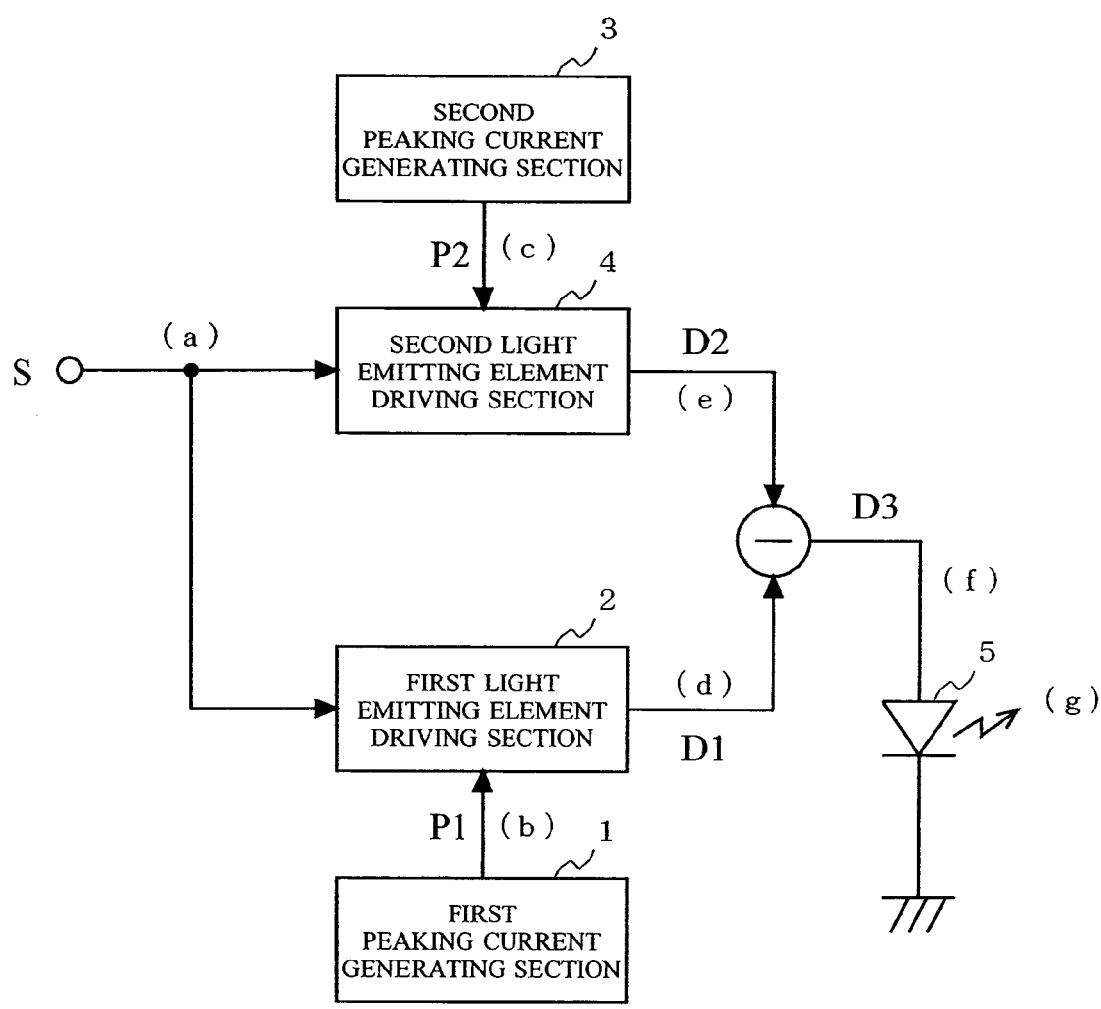
FIG. 1 is a functional block diagram showing a general configuration of an optical transmitter circuit that is common between first to fourth embodiments of the present invention.

FIG. 1 is a functional block diagram showing a general configuration of an optical transmitter circuit that is common between first to fourth embodiments of the present invention. Referring to FIG. 1, the optical transmitter circuit includes a first peaking current generating section 1, a first light emitting element driving section 2, a second peaking current generating section 3, a second light emitting element driving section 4, and a light emitting element 5. The light emitting element 5 may be, for example, a light emitting diode (LED), a laser diode (LD), a superluminescent diode (SLD), or a vertical cavity surface-emitting laser (VCSEL). In the following embodiments, it is assumed that the light emitting element 5 is included in the optical transmitter circuit. However, the light emitting element 5 may be separated from the rest of the circuit in other embodiments.

The operation of the optical transmitter circuit having such a configuration will now be described in detail with reference to the waveform diagrams of FIG. 2.

Figure 2:
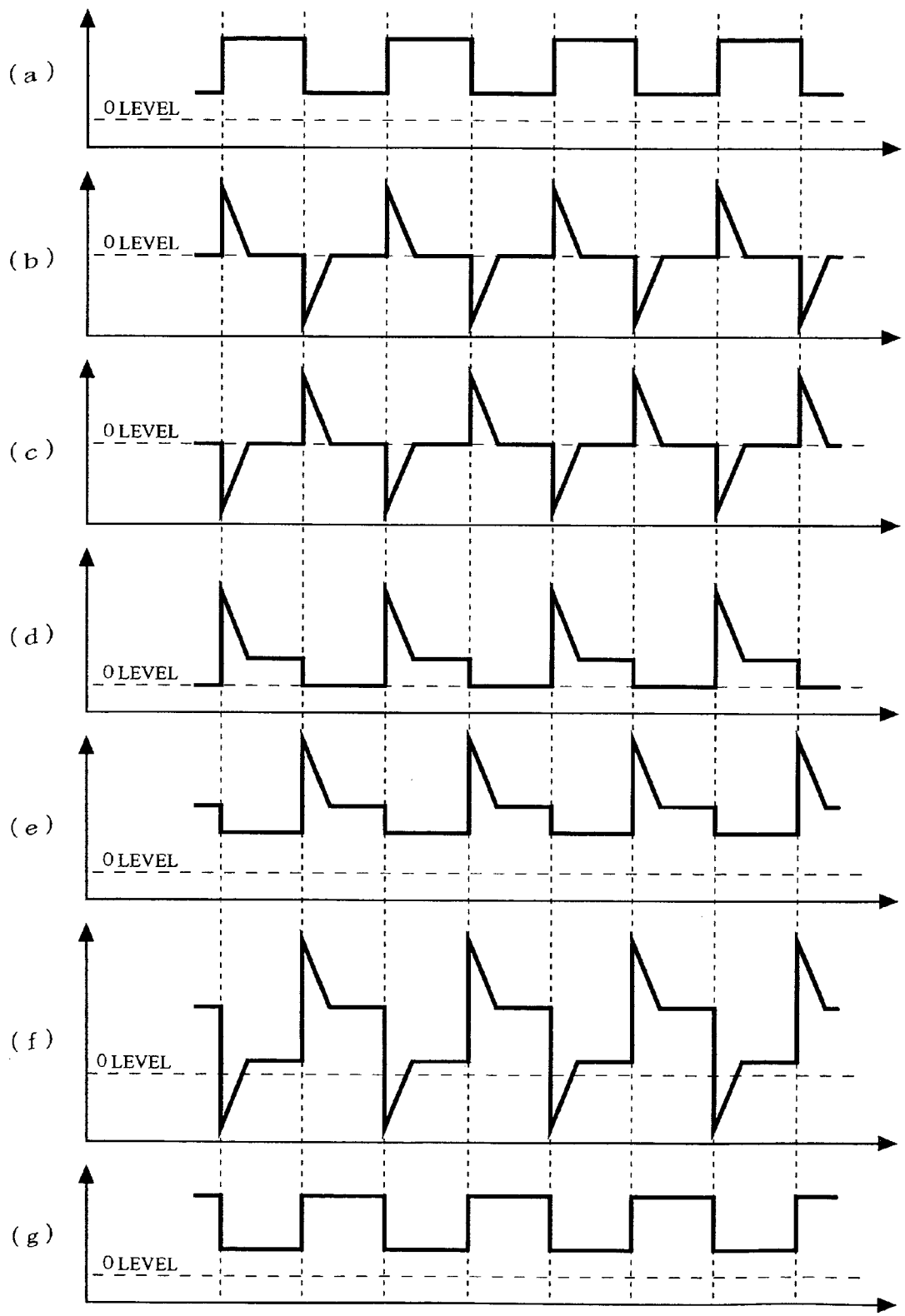
FIG. 2 shows waveform diagrams illustrating an operation of the optical transmitter circuit shown in FIG. 1.

The first light emitting element driving section 2 and the second light emitting element driving section 4 each receive a digital signal S (the waveform (a) of FIG. 2). The first peaking current generating section 1 generates a spire-shaped peaking current P1 (the waveform (b) of FIG. 2) that is in synchronism with the transitions of the digital signal S, being positive at the rising edge and negative at the falling edge. The second peaking current generating section 3 generates a spire-shaped peaking current P2 (the waveform (c) of FIG. 2) that is in synchronism with the transitions of the digital signal S, being negative at the rising edge and positive at the falling edge.

The first light emitting element driving section 2 receives the digital signal S and the peaking current P1, and produces a driving current D1 (the waveform (d) of FIG. 2) obtained by adding the peaking current P1 to the amplitude current of the digital signal S. In this process, the first light emitting element driving section 2 adjusts the DC current so that the produced driving current D1 has no peaking current around the falling edge.

The second light emitting element driving section 4 receives the digital signal S and the peaking current P2, and produces a driving current D2 (the waveform (e) of FIG. 2) obtained by adding the peaking current P2 to the amplitude current of the digital signal S. In this process, the second light emitting element driving section 4 adjusts the DC current so that the produced driving current D2 has no peaking current around the rising edge.

Outputted to the light emitting element 5 is a driving current D3 (the waveform (f) of FIG. 2) obtained by subtracting by a subtractor the driving current D1 produced in the first light emitting element driving section 2 from the driving current D2 produced in the second light emitting element driving section 4. The driving current D3 has a peaking current for the falling edge and another peaking current for the rising edge, and the amplitude current there is above the zero level. By inputting the driving current D3 to the light emitting element 5, there is obtained an optical signal (the waveform (g) of FIG. 2) with no deterioration in the amplitude waveform. Thus, the rising-edge peaking current and the falling-edge peaking current are produced by separate circuits, whereby it is possible to easily avoid the influence of clipping and thus to realize a high-speed response of the light emitting element 5.

Detailed configurations of the optical transmitter circuits of the present invention will now be described.

FIRST EMBODIMENT

Figure 3:
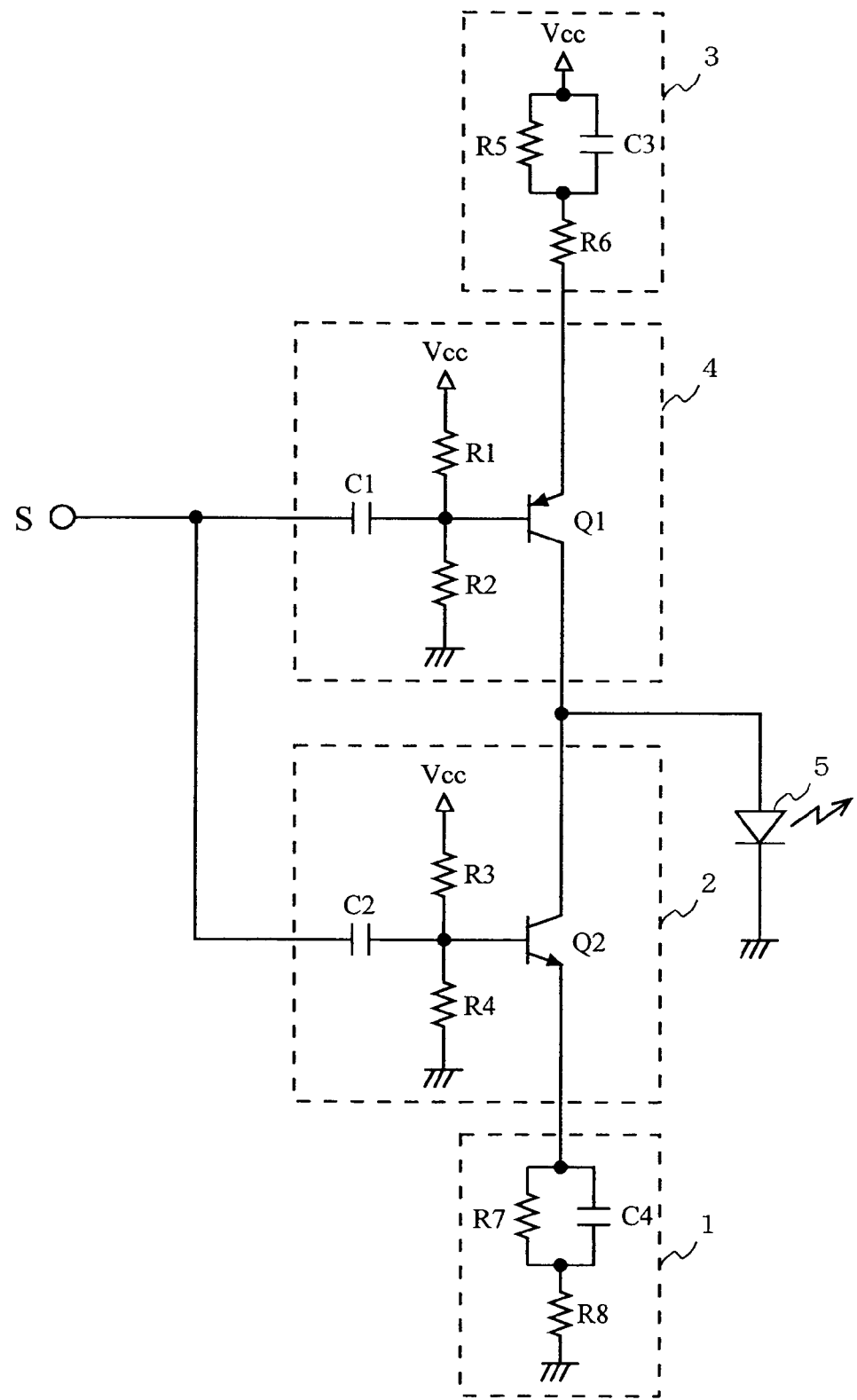
FIG. 3 shows, in detail, a configuration of an optical transmitter circuit according to the first embodiment of the present invention.

FIG. 3 shows, in detail, a configuration of an optical transmitter circuit according to the first embodiment of the present invention. In the optical transmitter circuit of the first embodiment, the functional blocks shown in FIG. 1 are each configured as follows.

The first light emitting element driving section 2 includes a transistor Q2, resistors R3 and R4, and a capacitor C2. The transistor Q2 may be an NPN-type bipolar transistor, an N-channel field effect transistor, or the like. The base of the transistor Q2 is connected to a power supply VCC via the resistor R3 and grounded via the resistor R4, and receives the digital signal S via the capacitor C2. The collector of the transistor Q2 is connected to the light emitting element 5. The resistor R3, the resistor R4 and the capacitor C2 are used for adjusting the DC current through the first light emitting element driving section 2.

The second light emitting element driving section 4 includes a transistor Q1, resistors R1 and R2, and a capacitor C1. The transistor Q1 may be a PNP-type bipolar transistor, a P-channel field effect transistor, or the like. The base of the transistor Q1 is connected to the power supply VCC via the resistor R1 and grounded via the resistor R2, and receives the digital signal S via the capacitor C1. The collector of the transistor Q1 is connected to the light emitting element 5. The resistor R1, the resistor R2 and the capacitor C1 are used for adjusting the DC current through the second light emitting element driving section 4.

The first peaking current generating section 1 includes resistors R7 and R8 and a capacitor C4. The resistor R7 and the resistor R8 are connected in series with each other, and are inserted between the emitter of the transistor Q2 of the first light emitting element driving section 2 and the ground. The capacitor C4 is connected in parallel to the resistor R7.

The second peaking current generating section 3 includes resistors R5 and R6 and a capacitor C3. The resistor R5 and the resistor R6 are connected in series with each other, and are inserted between the power supply VCC and the emitter of the transistor Q1 of the second light emitting element driving section 4. The capacitor C3 is connected in parallel to the resistor R5.

When the digital signal S transitions from high to low, the base voltage of the transistor Q2 decreases and the emitter voltage of the transistor Q2 accordingly becomes equal to the ground level, whereby the first light emitting element driving section 2 is turned OFF, and the second light emitting element driving section 4 is turned ON. Thus, the driving current D2, which is obtained by combining together the falling-edge peaking current outputted from the second light emitting element driving section 4 and the amplitude current adjusted by the resistors R1 and R2 of the second light emitting element driving section 4, is supplied from the emitter of the transistor Q1 to the light emitting element 5.

When the digital signal S transitions from low to high, the base voltage of the transistor Q2 increases, whereby the first light emitting element driving section 2 is turned ON, and the second light emitting element driving section 4 is brought to a state where it conducts therethrough only the bias voltage of the light emitting element 5 (=the driving current D2). Thus, the driving current D1, which is obtained by combining together the rising-edge peaking current outputted from the first light emitting element driving section 2 and the amplitude current adjusted by the resistors R3 and R4 of the first light emitting element driving section 2, flows from the collector of the transistor Q2 toward the emitter thereof. Since the driving current D1 in the opposite direction flows through the light emitting element 5, the falling-edge peaking current and the amplitude current are supplied to the light emitting element 5.

As described above, with the optical transmitter circuit according to the first embodiment of the present invention, a rising-edge peaking current and a falling-edge peaking current are supplied separately to thereby prevent the deterioration of the optical signal waveform outputted from the light emitting element 5. Thus, the light emitting element 5 can be driven with an intended rising speed and an intended falling speed.

SECOND EMBODIMENT

Figure 4:
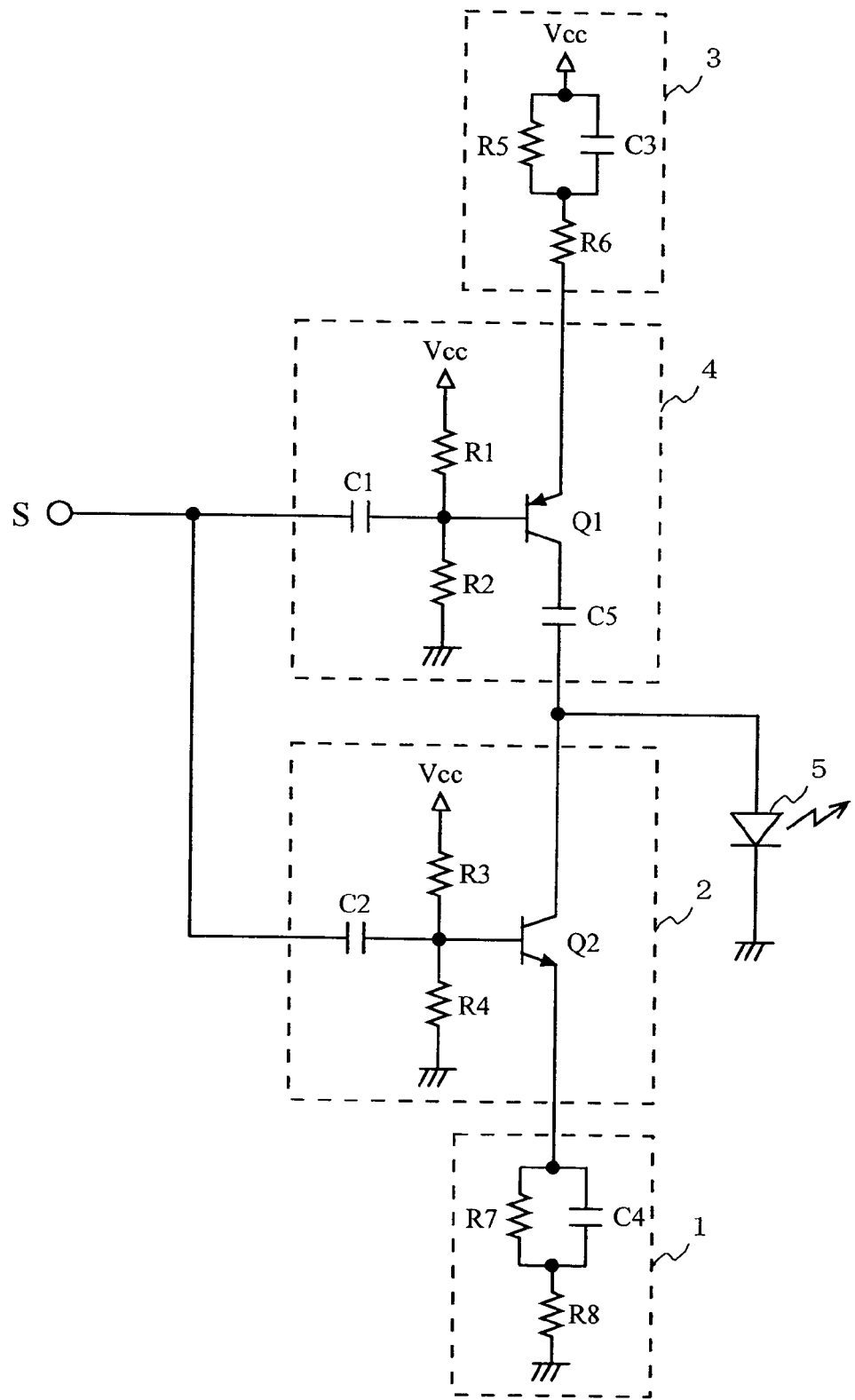
FIG. 4 shows, in detail, a configuration of an optical transmitter circuit according to the second embodiment of the present invention.

FIG. 4 shows, in detail, a configuration of an optical transmitter circuit according to the second embodiment of the present invention. The optical transmitter circuit of the second embodiment differs from the optical transmitter circuit of the first embodiment in the configuration of the second light emitting element driving section 4.

The second light emitting element driving section 4 includes the transistor Q1, the resistors R1 and R2, and capacitors C1 and C5. The resistor R1, the resistor R2 and the capacitor C1 are used for adjusting the DC current through the second light emitting element driving section 4. The capacitor C5 is inserted between the collector of the transistor Q1 and the light emitting element 5. With such a configuration, the driving current D2 outputted from the second light emitting element driving section 4 when the digital signal S is inputted is an AC component current obtained by cutting the DC component off the current shown in the waveform (e) of FIG. 2, i.e., only the falling-edge peaking current. The driving current D2 made only of an AC component and the driving current D1 outputted from the first light emitting element driving section 2 are supplied to the light emitting element 5.

As described above, with the optical transmitter circuit according to the second embodiment of the present invention, a DC component is cut off from the output of the second light emitting element driving section 4, whereby it is possible to obtain a greater amount of peaking current than that required for the amplitude current. Therefore, it is possible to drive the light emitting element 5 at a higher speed.

THIRD EMBODIMENT

Figure 5:
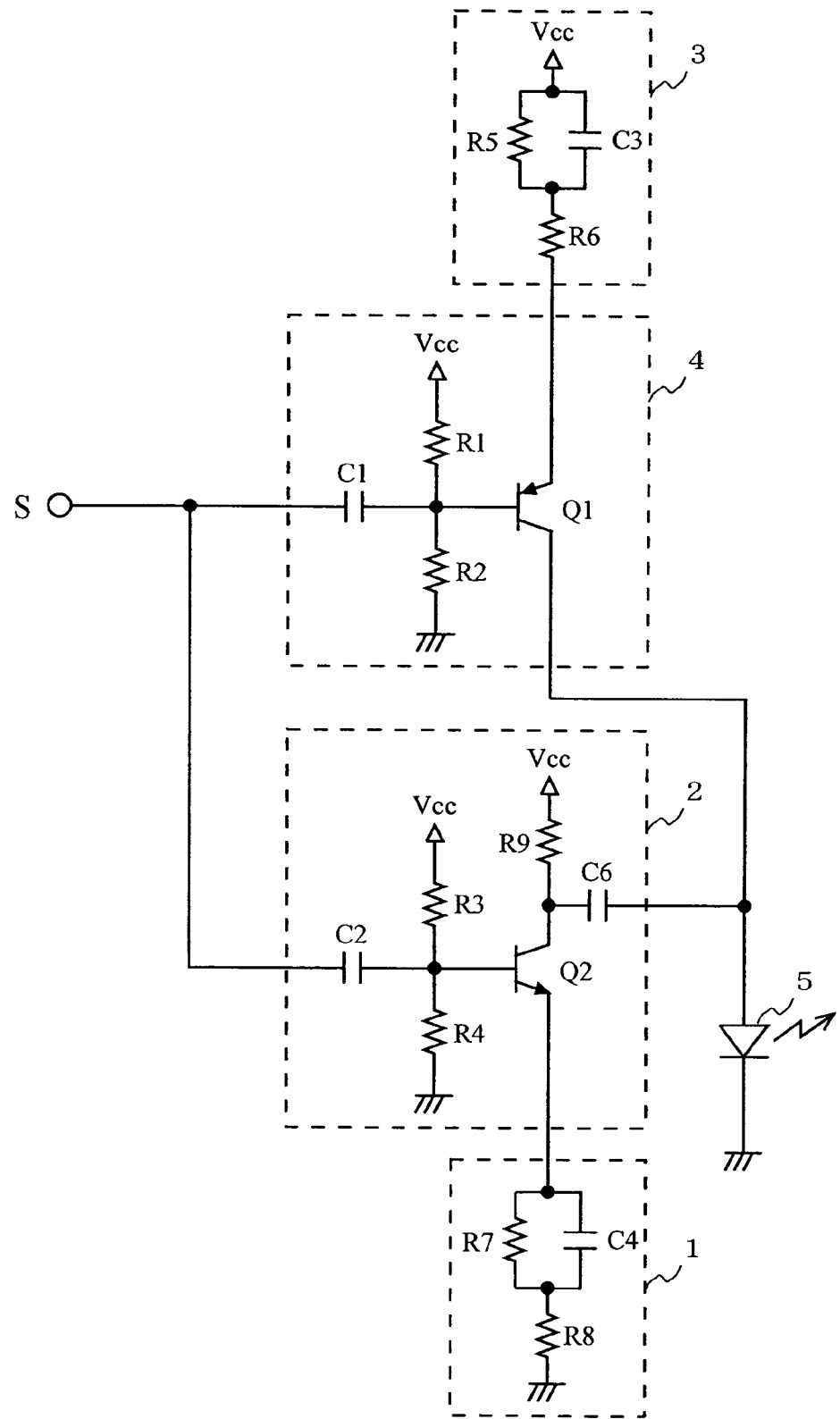
FIG. 5 shows, in detail, a configuration of an optical transmitter circuit according to the third embodiment of the present invention.

FIG. 5 shows, in detail, a configuration of an optical transmitter circuit according to the third embodiment of the present invention. The optical transmitter circuit of the third embodiment differs from the optical transmitter circuit of the first embodiment in the configuration of the first light emitting element driving section 2.

The first light emitting element driving section 2 includes the transistor Q2, the resistors R3, R4 and R9, and capacitors C2 and C6. The collector of the transistor Q2 is connected to the power supply VCC via a resistor R9, and is connected to the light emitting element 5 via the capacitor C6. With such a configuration, the driving current D1 outputted from the first light emitting element driving section 2 when the digital signal S is inputted is an AC component current obtained by cutting the DC component off the current shown in the waveform (d) of FIG. 2, i.e., only the rising-edge peaking current. The driving current D1 made only of an AC component and the driving current D2 outputted from the second light emitting element driving section 4 are supplied to the light emitting element 5.

As described above, with the optical transmitter circuit according to the third embodiment of the present invention, a DC component is cut off from the output of the first light emitting element driving section 2, whereby it is possible to obtain a greater amount of peaking current than that required for the amplitude current. Therefore, it is possible to drive the light emitting element 5 at a higher speed.

Fourth Embodiment

Figure 6:
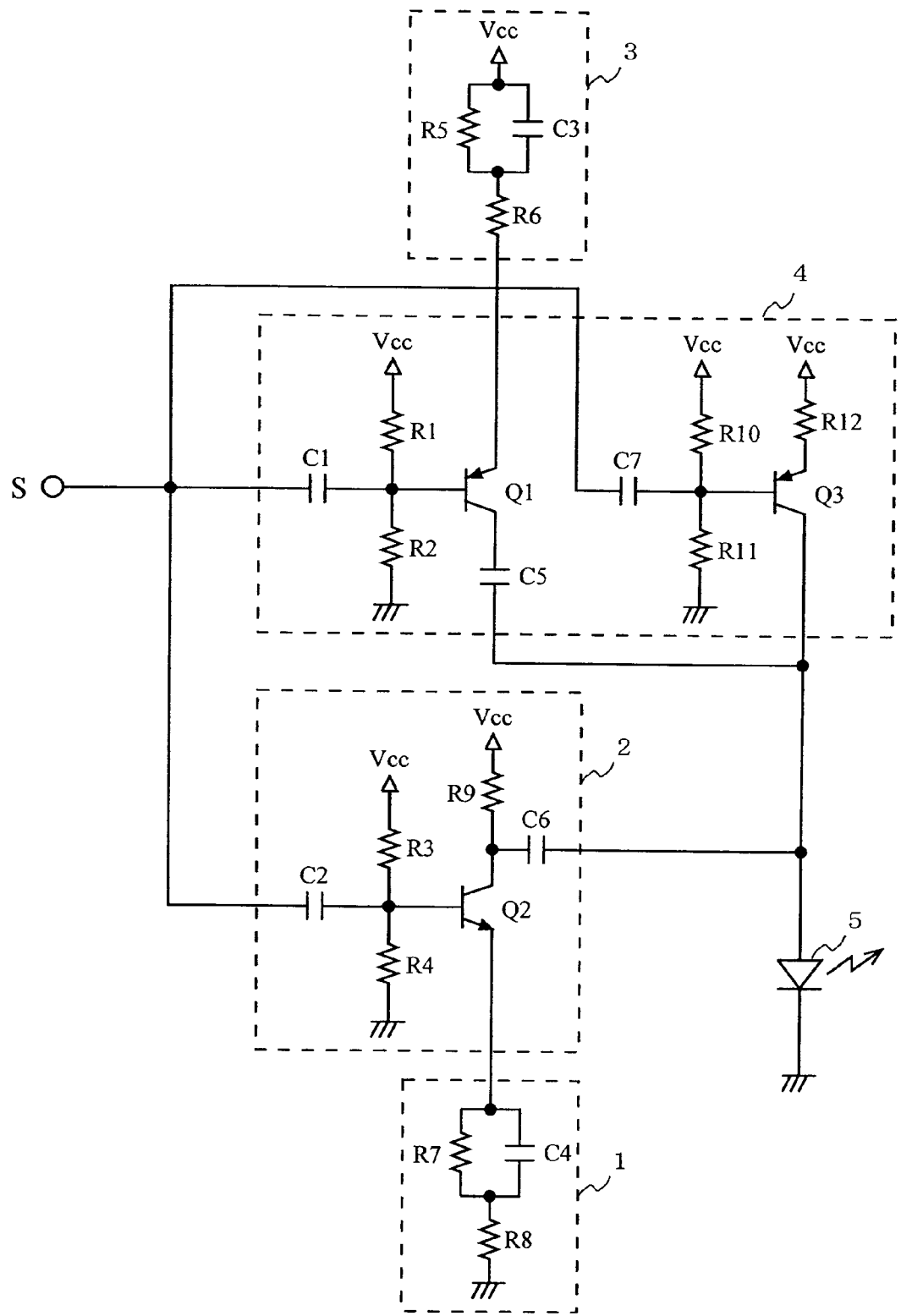
FIG. 6 shows, in detail, a configuration of an optical transmitter circuit according to the fourth embodiment of the present invention.

FIG. 6 shows, in detail, a configuration of an optical transmitter circuit according to the fourth embodiment of the present invention. The optical transmitter circuit of the fourth embodiment differs from the optical transmitter circuit of the first embodiment in the configuration of the first light emitting element driving section 2 and the second light emitting element driving section 4.

As in the third embodiment, the first light emitting element driving section 2 includes the transistor Q2, the resistors R3, R4 and R9, and the capacitors C2 and C6.

The second light emitting element driving section 4 includes a circuit block A and a circuit block B. The circuit block A includes the transistor Q1, the resistors R1 and R2, and the capacitors C1 and C5, as in the second embodiment. The circuit block B includes a transistor Q3, resistors R10 and R11, and a capacitor C7. The transistor Q3 may be a PNP-type bipolar transistor, a P-channel field effect transistor, or the like.

Only the rising-edge peaking current is outputted, as described above in the third embodiment, from the first light emitting element driving section 2. Only the falling-edge peaking current is outputted, as described above in the second embodiment, from the circuit block A of the second light emitting element driving section 4, and an amplitude current obtained by adjusting the DC current of the digital signal S is outputted from the circuit block B (=the third light emitting element driving section).

As described above, with the optical transmitter circuit according to the fourth embodiment of the present invention, the peaking currents for compensating for the rising speed and the falling speed and the amplitude current are supplied to the light emitting element 5, whereby it is possible to more easily drive the light emitting element 5 with an intended rising speed and an intended falling speed.

Figure 7:
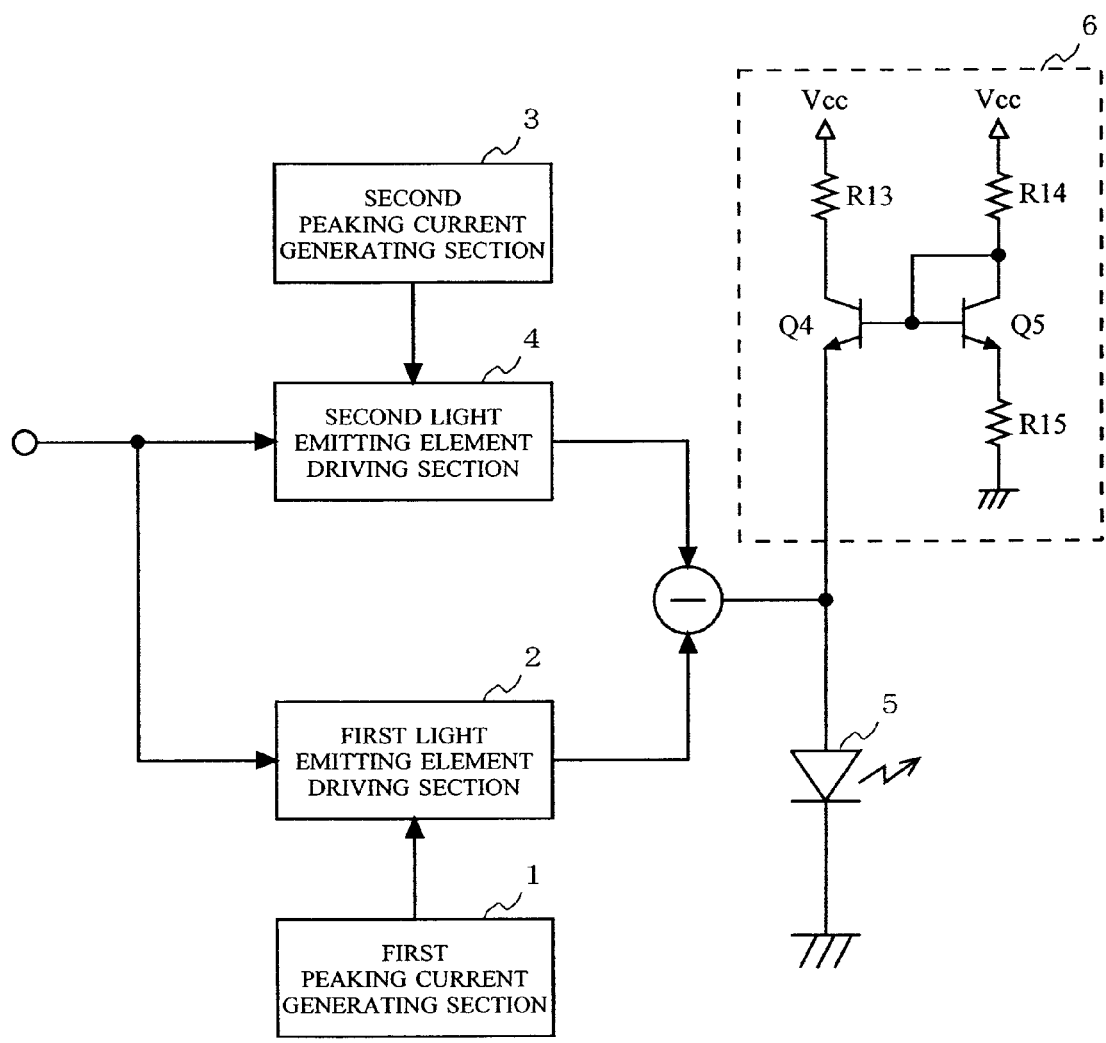
FIG. 7 shows, in detail, a configuration of an optical transmitter circuit according to an alternative embodiment of the present invention.

A DC current supply section 6 may be further included, as shown in FIG. 7, in the circuit described above in the first to fourth embodiments, for adjusting the amount of DC current to be supplied to the light emitting element 5. While a current mirror circuit is used in FIG. 7 as an example of the DC current supply section 6, it may be any other suitable configuration capable of supplying a DC current.

FIFTH EMBODIMENT

As described above, it is ideal to use the driving current D3 shown in the waveform (f) of FIG. 2 for driving the light emitting element 5. However, a research by the present inventors has revealed that the optical transmitter circuit can be used in practice even if the falling-edge peaking current is reduced to some extent.

Fifth to ninth embodiments of the present invention are directed to optical transmitter circuits in which the falling-edge peaking current is reduced to thereby reduce the power consumption.

First, the degree to which the falling-edge peaking current can be reduced will be discussed below. Mathematical expressions used in the following discussion are based on the configuration of the peaking current generating section 3, and it is understood that the expressions vary for different circuit configurations.

Figure 8:
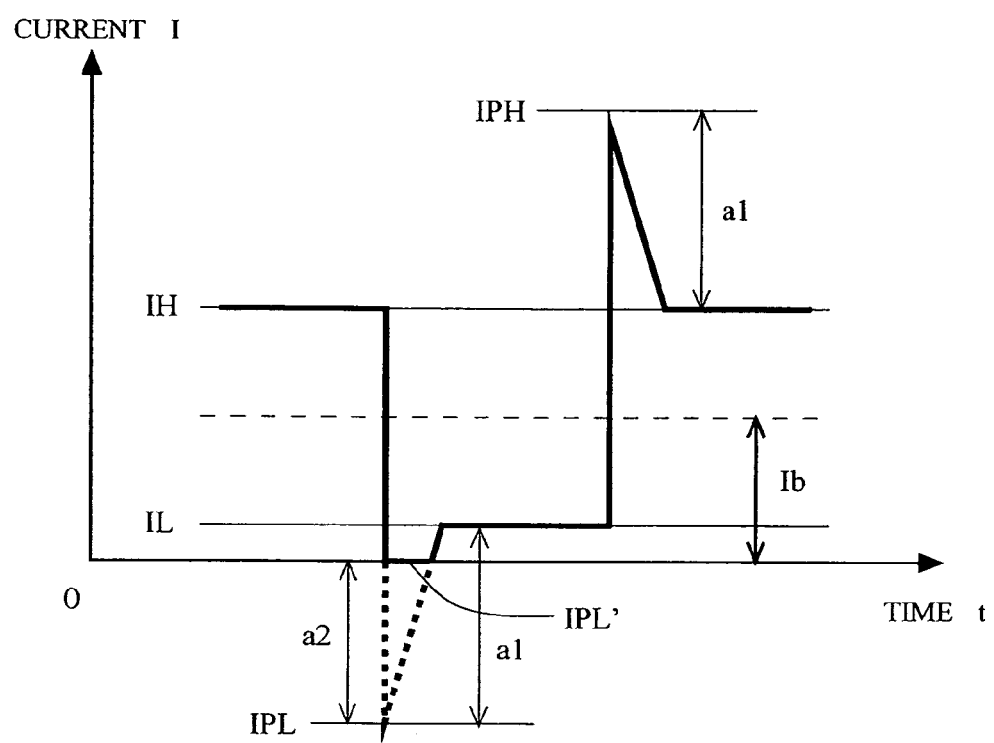
FIG. 8 is a waveform diagram illustrating an operation of an optical transmitter circuit according to fifth to ninth embodiments of the present invention.

In the driving current waveform of FIG. 8, the absolute value IPH of the rising-edge peak current and the absolute value IPL of the falling-edge peak current can be expressed as shown in Expressions 1 and 2, respectively, where IH is the high-level current of the digital signal S, IL is the low-level current thereof, R5 and R6 are resistance values of the resistors R5 and R6 of the second peaking current generating section 3. B1 is a constant.

$$IPH = B1 \times (R5/R6) \times (IH-IL) + IH \qquad \text{Exp. 1}$$

$$IPL = -B1 \times (R5/R6) \times (IH-IL) + IL \qquad \text{Exp. 2}$$

Hence, the peaking current amount a1 shown in FIG. 8 can be expressed as shown in Expression 3 below.

$$a1 = IPH - IH = IL - IPL = B1 \times (R5/R6) \times (IH-IL) \qquad \text{Exp. 3}$$

The operation when clipping occurs as shown in FIG. 8 will now be discussed. As the bias current Ib supplied to the base of the transistor Q1 is decreased, the falling-edge peak current IPL decreases below the zero level. In practice, however, clipping occurs in the light emitting element 5, and the peak current (=IPL') is at the zero level. Thus, with regard to the falling-edge peak current IPL where clipping occurs, it is considered that a current equal to the falling-edge peak current with no clipping is flowing below the zero level. Therefore, the clipping current a2 can be expressed by using the absolute value IPL of the falling-edge peak current as shown in Expression 4 below.

$$a2 = -IPL \qquad \text{Exp. 4}$$

For example, where the light emitting element 5 is driven with a transmission speed of 500 Mbps and a pulse current amplitude (=IH-IL) of 14.4 mApp, the bias current Ib required for the condition (a2/a1=0) under which clipping does not occur is experimentally 139.5 mA, and B1×(R5/R6)=9.15. The rising-edge peak current IPH and the falling-edge peak current IPL are 278.4 mA and 0 mA based on Expressions 1 and 2, respectively. When the bias current Ib is gradually decreased from the condition under which clipping does not occur, clipping occurs, and the output waveform of the light emitting element 5 becomes deteriorated. Then, the value of a2/a1 at which the fall time tf is 1 ns (equivalent to a transmission speed of 500 Mbps) is determined to be about 0.8. Under the condition where the a2/a1=0.8, the bias current Ib is 36.6 mA, whereby the power consumption can be reduced by about 75% compared with a case where clipping does not occur. Other values are as follows: IPH=175.5 mA, IPL'=0 mA (IPL=−102.9 mA), a1=131.7 mA, and a2=102.9 mA.

Figure 9:
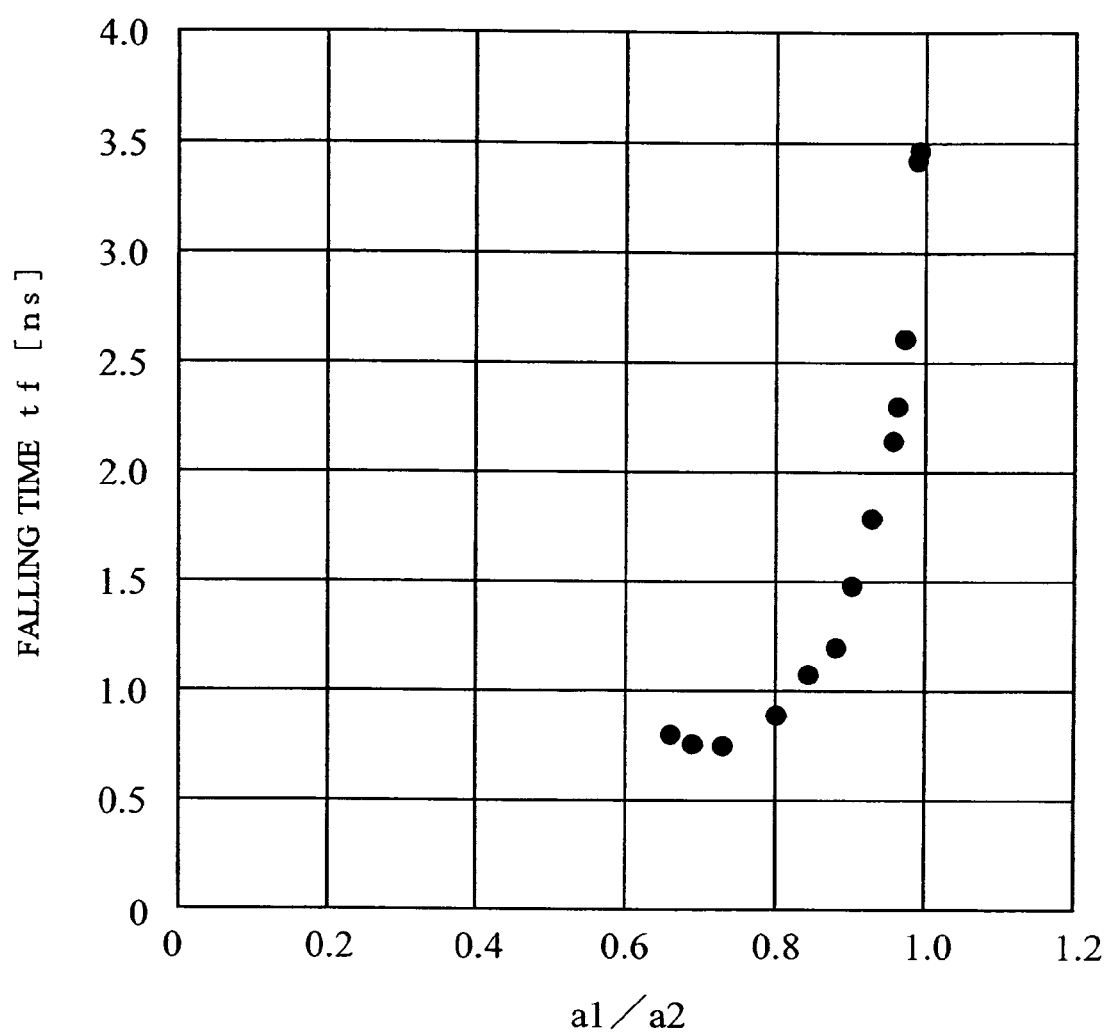
FIG. 9 shows the relationship between a clipping current and a fall time of an optical transmitter circuit according to fifth to ninth embodiments of the present invention.

FIG. 9 shows experimental results for the fall time tf when a2/a1 (i.e., the ratio between the peaking current amount a1 and the clipping current amount a2) was varied with the pulse current amplitude (=IH-IL) and the bias current Ib being parameters. The greater the fall time tf is, the lower the response speed is. Where the transmission speed is 500 Mbps with the fall time tf being 1 ns, a high response speed of 500 Mbps can be realized by setting a2/a1 to satisfy Expression 5 below.

$$0 < \frac{a2}{a1} \leq 0.8 \qquad \text{Exp. 5}$$

FIG. 9 can be represented by Expression 6 below. With regard to the time tf, the fall time of the pulse determined by the peaking current (the first term) is dominant when a2/a1 is small, and the fall time determined by clipping current outputted from the light emitting element driving section 4 (the second term) is dominant when a2/a1 is large. In Expression 6, A1, A2, N1 and N2 are constants. The time constant τ1 in the first term is determined by the transient response of the peak current set by the resistors R5 and R6 and the capacitor C3 of the second peaking current generating section 3, and the second time constant τ2 is determined by the transient response of the transistor Q1 and the light emitting element 5 of the second light emitting element driving section 4. Thus, a2/a1 can be set according to the transmission speed.

$$tf = -A_1 \cdot \tau_1 \cdot \ln\left\{1 - N_1\left(1 - \frac{a_2}{a_1}\right)\right\} - A_2 \cdot \tau_2 \cdot \ln\left(1 - N_2 \cdot \frac{a_2}{a_1}\right) \qquad \text{Exp. 6}$$

The optical transmitter circuit according to the fifth embodiment of the present invention will now be described.

Figure 10:
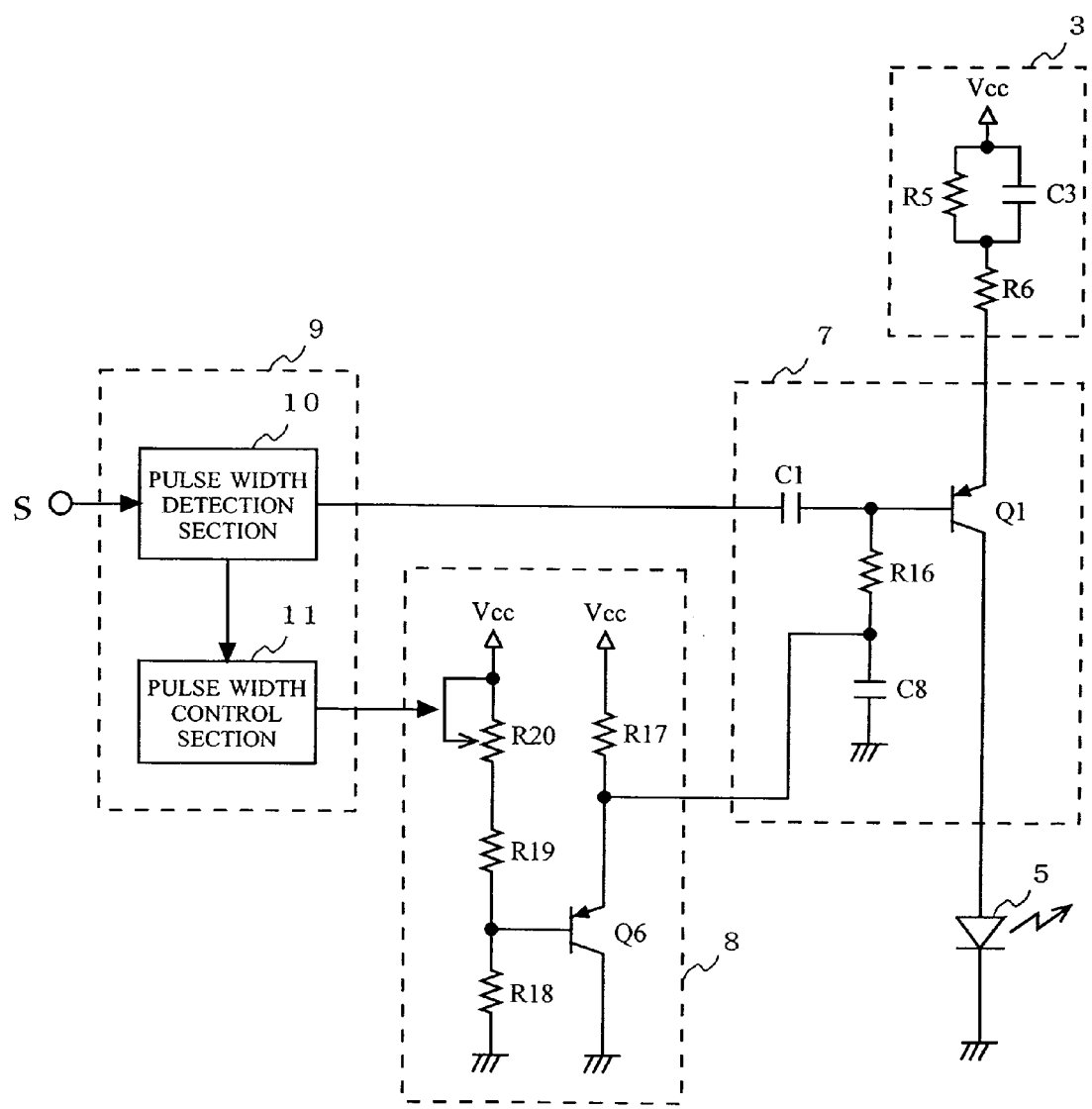
FIG. 10 shows, in detail, a configuration of an optical transmitter circuit according to the fifth embodiment of the present invention.

FIG. 10 shows a configuration of the optical transmitter circuit according to the fifth embodiment of the present invention. Referring to FIG. 10, the optical transmitter circuit of the fifth embodiment includes the peaking current generating section 3, the light emitting element 5, a light emitting element driving section 7, a clipping section 8, and a signal analysis section 9. The signal analysis section 9 includes a pulse width detection section 10 and a pulse width control section 11. The configurations of the peaking current generating section 3 and the light emitting element 5 are as described above in the first to fourth embodiments. The optical transmitter circuit of the fifth embodiment will now be described while focusing on the light emitting element driving section 7, the clipping section 8, the pulse width detection section 10 and the pulse width control section 11 whose configurations are different from the above embodiments.

The light emitting element driving section 7 includes the transistor Q1, a resistor R16, and the capacitors C1 and C8. The transistor Q1 may be a PNP-type bipolar transistor, P-channel field effect transistor, or the like. The base of the transistor Q1 is grounded via the resistor R16 and a capacitor C8 connected in series with each other, and receives the digital signal S via the capacitor C1. The collector of the transistor Q1 is connected to the light emitting element 5. The DC voltage outputted from the clipping section 8 is applied to the connecting point between the resistor R16 and the capacitor C8.

Figure 11:
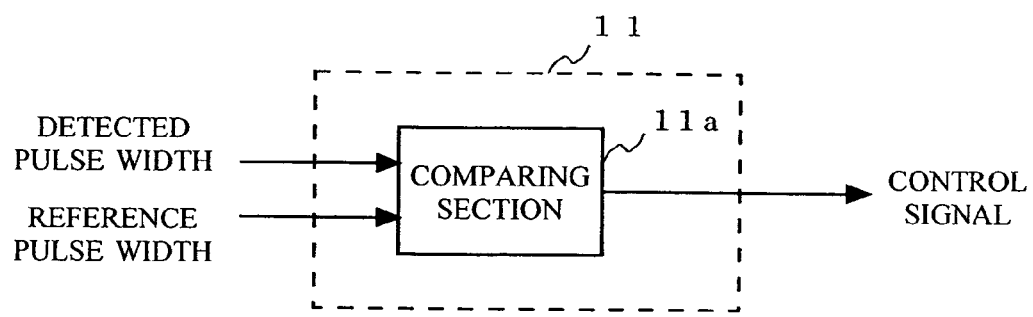
FIG. 11 is a detailed circuit diagram of a pulse width control section 11.

The pulse width detection section 10 outputs the received digital signal S to the light emitting element driving section 7, detects the pulse width of the digital signal S, and outputs the detection result to the pulse width control section 11 as the detected pulse width. The pulse width control section 11 includes a comparing section 11a, for example, as shown in FIG. 11, for comparing a predetermined reference pulse width with the detected pulse width to output a control signal based on the comparison result to the clipping section 8. While an example of the pulse width detection section 10 may be a section for detecting the falling or rising edge of the pulse, any other suitable configuration may be employed. While the comparing section 11a is used as an example of the pulse width detection section 10, there may be provided a memory section storing various control signals so that one of the control signals is read out from the memory section according to the detected pulse width.

The clipping section 8 includes resistors R17 to R19, a variable resistor R20, and a transistor Q6. The transistor Q6 may be a PNP-type bipolar transistor, a P-channel field effect transistor, or the like. The variable resistor R20, the resistor R19, and the resistor R18 are connected in series with one another, and are inserted between the power supply VCC and GND. The connecting point between the resistor R18 and the resistor R19 is connected to the base of the transistor Q6. The emitter of the transistor Q6 is connected to the power supply VCC via the resistor R17, and the DC voltage appearing at the emitter is outputted to the connecting point between the resistor R16 and the capacitor C8 of the light emitting element driving section 7. The collector of the transistor Q6 is grounded. The resistance value of the variable resistor R20 varies according to the control signal outputted from the pulse width control section 11. The variation of the resistance value is controlled so as to adjust the amount of clipping so that the ratio of the clipping current amount with respect to the peaking current amount is less than or equal to a predetermined value.

For example, where the detected pulse width is longer than the reference pulse width (i.e., a lower transmission speed), the bias current Ib of the clipping section 8 is decreased. Where the detected pulse width is shorter than the reference pulse width (i.e., a higher transmission speed), the bias current Ib of the clipping section 8 is increased. Thus, it is possible to supply, to the light emitting element 5, a driving current with the clipping current amount a2 being adjusted to a value according to the transmission speed of the digital signal S.

As described above, with the optical transmitter circuit according to the fifth embodiment of the present invention, it is possible to automatically adjust the amount of clipping so that the ratio of the clipping current amount with respect to the peaking current amount is less than or equal to a predetermined value, according to the transmission speed of the digital signal S, thus arriving at the minimum amount of clipping for the transmission speed. Thus, it is possible to realize a high response speed of the light emitting element 5 while reducing the power consumption.

SIXTH EMBODIMENT

Figure 12:
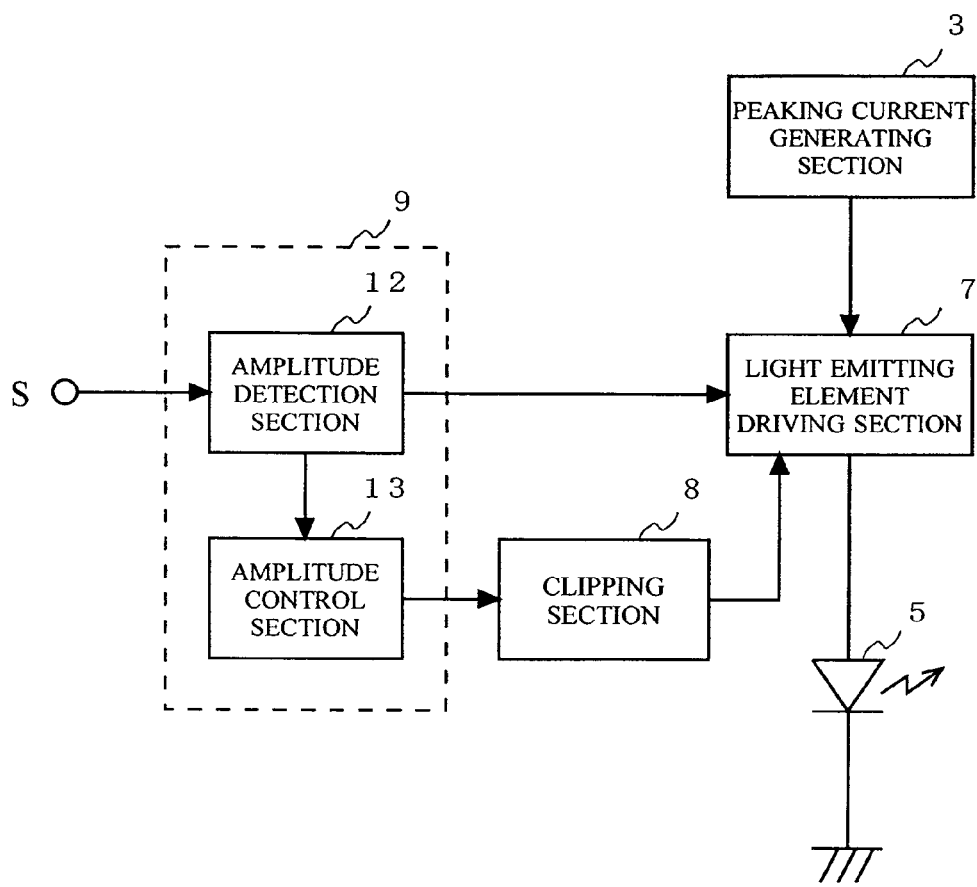
FIG. 12 shows, in detail, a configuration of an optical transmitter circuit according to the sixth embodiment of the present invention.

FIG. 12 shows a configuration of the optical transmitter circuit according to the sixth embodiment of the present invention. Referring to FIG. 12, the optical transmitter circuit of the sixth embodiment includes the peaking current generating section 3, the light emitting element 5, the light emitting element driving section 7, the clipping section 8, and the signal analysis section 9. The signal analysis section 9 includes an amplitude detection section 12 and an amplitude control section 13. The sixth embodiment differs from the fifth embodiment in the configurations of the amplitude detection section 12 and the amplitude control section 13. The optical transmitter circuit of the sixth embodiment will now be described while focusing on these configurations different from those of the first embodiment.

Figure 13:
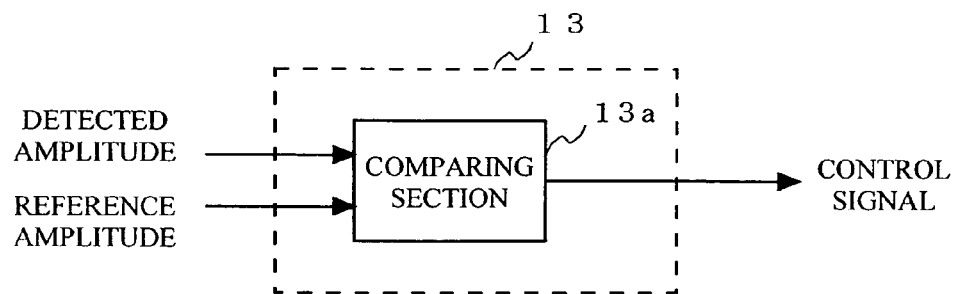
FIG. 13 is a detailed circuit diagram of an amplitude control section 13.

The amplitude detection section 12 outputs the received digital signal S to the light emitting element driving section 7, detects the amplitude of the digital signal S, and outputs the detection result to the amplitude control section 13 as the detected amplitude. The amplitude control section 13 includes a comparing section 13a, for example, as shown in FIG. 13, for comparing a predetermined reference amplitude with the detected amplitude to output a control signal based on the comparison result to the clipping section 8. Instead of the comparing section 13a, there may be provided a memory section storing various control signals so that one of the control signals is read out from the memory section according to the detected amplitude. The clipping section 8 varies the resistance value of the variable resistor R20 shown in FIG. 10 according to the control signal outputted from the amplitude control section 13 so as to adjust the amount of clipping so that the ratio of the clipping current amount with respect to the peaking current amount is less than or equal to a predetermined value.

For example, where the detected amplitude is larger than the reference amplitude, the peak current occurring in the peaking current generating section 3 becomes large, whereby the bias current Ib of the clipping section 8 is increased. Where the detected amplitude is smaller than the reference amplitude, the bias current Ib of the clipping section 8 is decreased. Thus, it is possible to supply, to the light emitting element 5, a driving current with the clipping current amount a2 being adjusted to a value according to the amplitude of the digital signal S.

As described above, with optical transmitter circuit according to the sixth embodiment of the present invention, it is possible to automatically adjust the amount of clipping so that the ratio of the clipping current amount with respect to the peaking current amount is less than or equal to a predetermined value, according to the amplitude of the digital signal S, thus arriving at the minimum amount of clipping required for the amplitude. Thus, it is possible to realize a high response speed of the light emitting element 5 while reducing the power consumption.

SEVENTH EMBODIMENT

Figure 14:
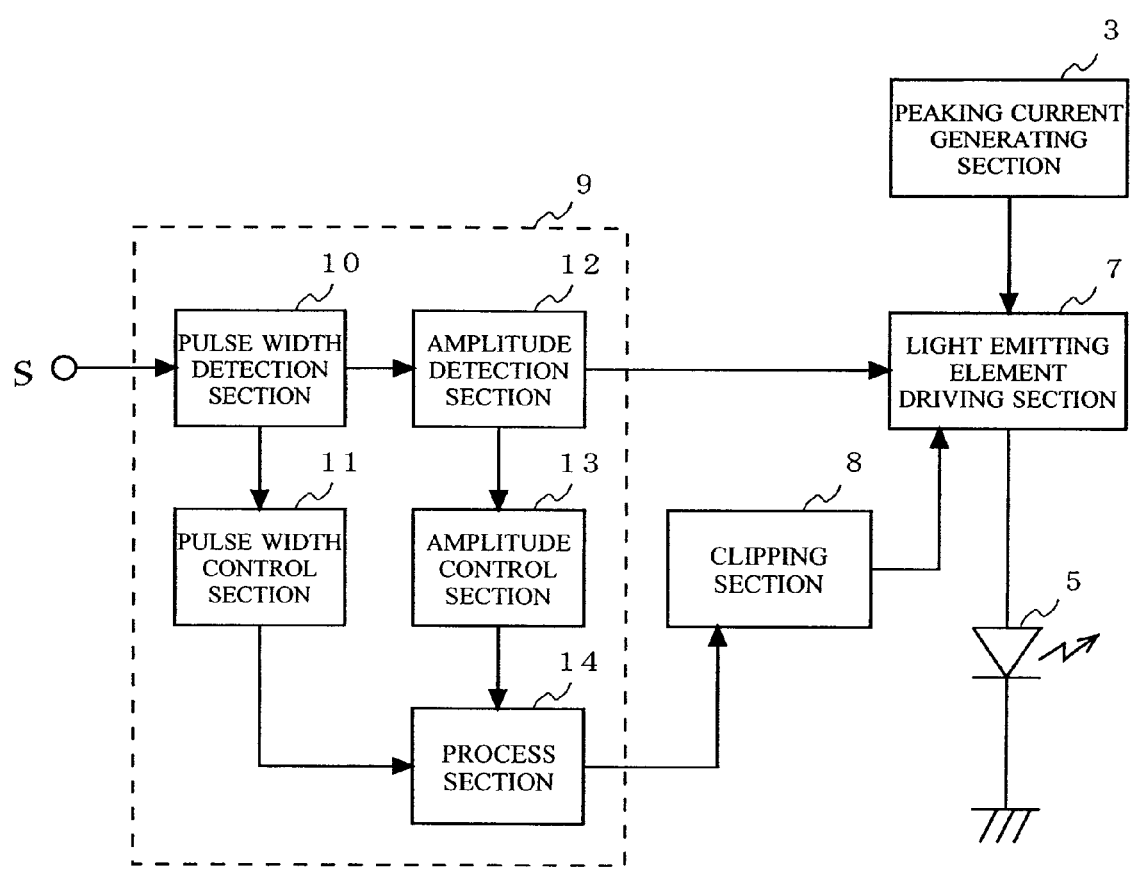
FIG. 14 shows, in detail, a configuration of an optical transmitter circuit according to the seventh embodiment of the present invention.

FIG. 14 shows a configuration of the optical transmitter circuit according to the seventh embodiment of the present invention. Referring to FIG. 14, the optical transmitter circuit of the seventh embodiment includes the peaking current generating section 3, the light emitting element 5, the light emitting element driving section 7, the clipping section 8, and the signal analysis section 9. The signal analysis section 9 includes the pulse width detection section 10, the pulse width control section 11, the amplitude detection section 12, the amplitude control section 13, and a process section 14. The configuration of the seventh embodiment is obtained by combining the fifth embodiment with the sixth embodiment, with the process section 14 being the difference from the above embodiments. The optical transmitter circuit of the seventh embodiment will now be described while focusing on these configurations different from those of the above embodiments.

The process section 14 adds together a control signal outputted from the pulse width control section 11 and a control signal outputted from the amplitude control section 13, and outputs the addition result to the clipping section 8 as the final control signal. Thus, it is possible to output a control signal according both to the transmission speed and to the amplitude of the digital signal S.

As described above, with the optical transmitter circuit according to the seventh embodiment of the present invention, it is possible to automatically adjust the amount of clipping so that the ratio of the clipping current amount with respect to the peaking current amount is less than or equal to a predetermined value, according both to the transmission speed and to the amplitude of the digital signal S, thus arriving at the minimum amount of clipping required for the transmission speed and the amplitude. Thus, it is possible to realize a high response speed of the light emitting element 5 while reducing the power consumption.

The process of detecting the transmission speed of the digital signal S and the process of detecting the amplitude of the digital signal S may be switched around. While the process section 14 adds together the control signal from the pulse width control section 11 and the control signal from the amplitude control section 13, and outputs the addition result as the final control signal in the example described above, there may be provided a memory section storing various final control signals so that one of the final control signals is read out from the memory section according to various control signals.

EIGHTH EMBODIMENT

Figure 15:
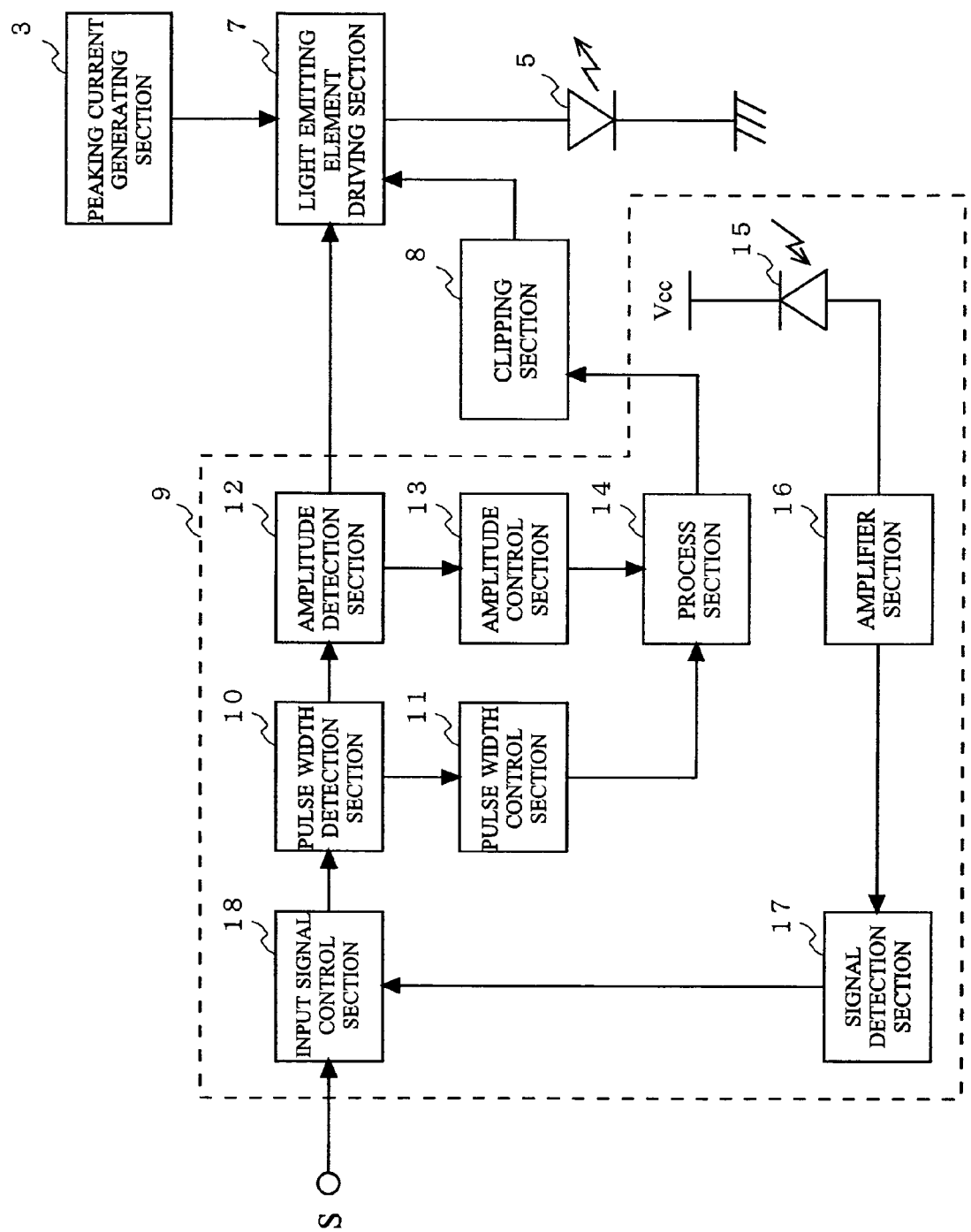
FIG. 15 shows, in detail, a configuration of an optical transmitter circuit according to the eighth embodiment of the present invention.

FIG. 15 shows a configuration of the optical transmitter circuit according to the eighth embodiment of the present invention. Referring to FIG. 15, the optical transmitter circuit of the eighth embodiment includes the peaking current generating section 3, the light emitting element 5, the light emitting element driving section 7, the clipping section 8, and the signal analysis section 9. The signal analysis section 9 includes the pulse width detection section 10, the pulse width control section 11, the amplitude detection section 12, the amplitude control section 13, the process section 14, a light receiving element 15, an amplifier section 16, a signal detection section 17, and an input signal control section 18. The eighth embodiment differs from the seventh embodiment in the configurations of the light receiving element 15, the amplifier section 16, the signal detection section 17, and the input signal control section 18. The optical transmitter circuit of the eighth embodiment will now be described while focusing on these configurations different from those of the seventh embodiment.

The light receiving element 15 receives an optical signal from a communication unit (not shown) with which the optical transmitter circuit is communicating, and outputs an electrical signal according to the optical signal to the amplifier section 16. An antenna may be provided instead of the light receiving element 15, in which case the optical transmitter circuit receives a wireless signal from the communication unit. The amplifier section 16 amplifies the electrical signal from the light receiving element 15 with a predetermined gain. The signal detection section 17 detects the amplitude of the electrical signal amplified by the amplifier section 16, and outputs the detection result to the input signal control section 18 as the detected signal.

Figure 16:
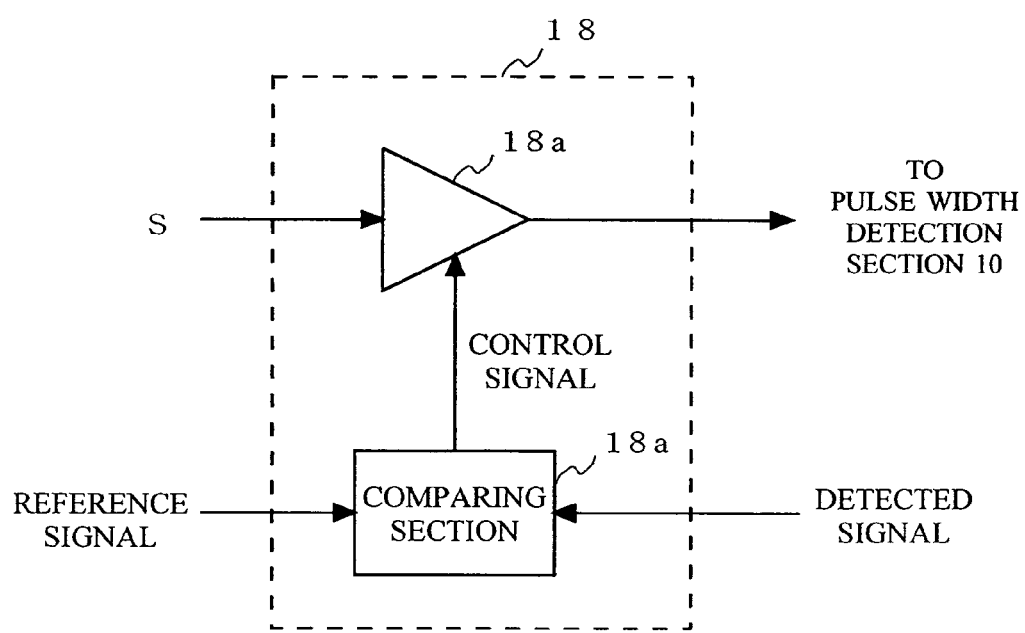
FIG. 16 is a detailed circuit diagram of an input signal control section 18.

The input signal control section 18 includes, for example, a comparing section 18a and a variable gain amplifier 18b, as shown in FIG. 16. The comparing section 18a compares a predetermined reference signal with the detected signal to output a control signal based on the comparison result to the variable gain amplifier 18b as a gain control signal. The variable gain amplifier 18b controls the amplitude of the digital signal S according to the gain control signal. Any other suitable unit may be used instead of the variable gain amplifier 18b, as long as the amplitude of the digital signal S can be controlled. The digital signal S whose amplitude is controlled is inputted to the pulse width detection section 10.

For example, where the transmission distance is long and the optical signal received by the light receiving element 15 is small, the signal detection section 17 detects an amplitude smaller than the amplitude being the reference in the input signal control section 18, whereby the input signal control section 18 performs a control operation such that the amplitude of the digital signal S is increased. Based on the result, the bias current Ib of the clipping section 8 is increased. Where the transmission distance is short and the optical signal received by the light receiving element 15 is large, a control operation opposite to the above operation is performed.

As described above, with the optical transmitter circuit according to the eighth embodiment of the present invention, it is possible to automatically adjust the amount of clipping so that the ratio of the clipping current amount with respect to the peaking current amount is less than or equal to a predetermined value, according both to the transmission speed and to the amplitude of the digital signal S based on the distance to the communication unit over which signals are transmitted, thus arriving at the minimum amount of clipping required for the transmission speed and the amplitude. Thus, it is possible to realize a high response speed of the light emitting element 5 while reducing the power consumption.

NINTH EMBODIMENT

Figure 17:
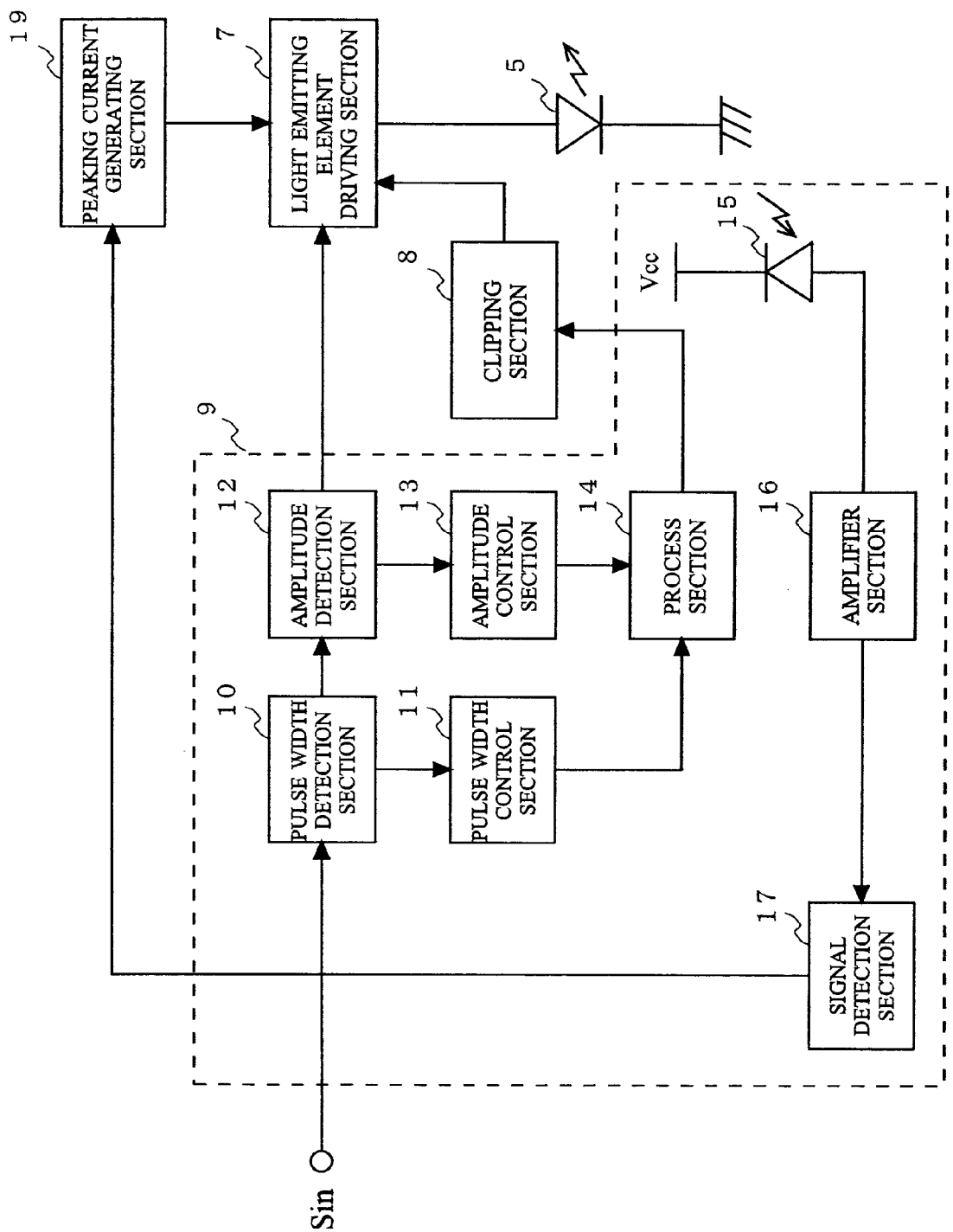
FIG. 17 shows, in detail, a configuration of an optical transmitter circuit according to the ninth embodiment of the present invention.

FIG. 17 shows a configuration of the optical transmitter circuit according to the ninth embodiment of the present invention. Referring to FIG. 17, the optical transmitter circuit of the ninth embodiment includes the peaking current generating section 19, the light emitting element 5, the light emitting element driving section 7, the clipping section 8, and the signal analysis section 9. The signal analysis section 9 includes the pulse width detection section 10, the pulse width control section 11, the amplitude detection section 12, the amplitude control section 13, the process section 14, the light receiving element 15, the amplifier section 16, and the signal detection section 17. The ninth embodiment differs from the eighth embodiment in the configuration of the peaking current generating section 19. The optical transmitter circuit of the ninth embodiment will now be described while focusing on the configuration different from that of the eighth embodiment.

Figure 18:
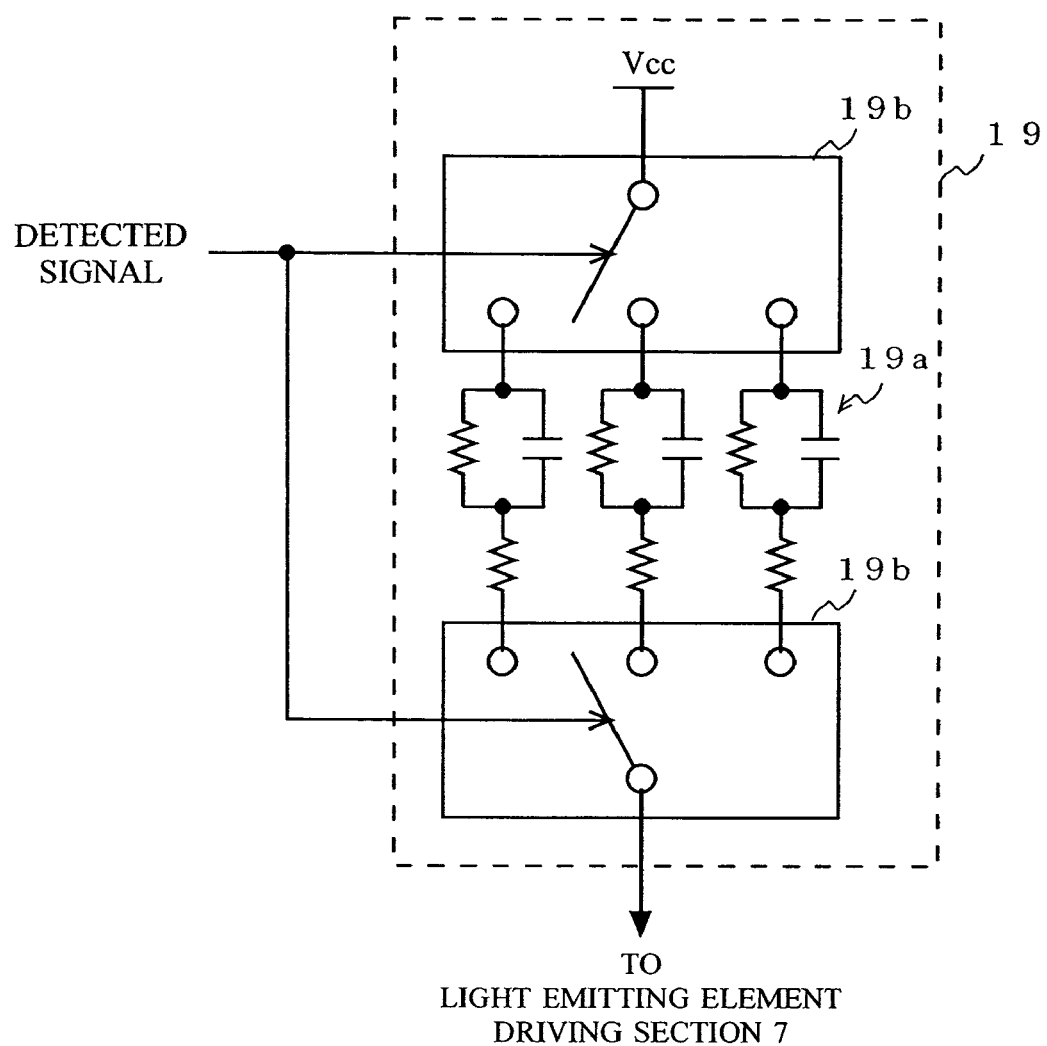
FIG. 18 is a detailed circuit diagram of a peaking current generating section 19.

The signal detection section 17 detects the amplitude of the electrical signal amplified by the amplifier section 16, and outputs the detection result to the peaking current generating section 19 as the detected signal. The peaking current generating section 19 includes a plurality of waveform peaking sections 19a of different values and a selector section 19b, for example, as shown in FIG. 18. The selector section 19b selects one of the waveform peaking sections 19a of different values according to the detected signal.

As described above, with the optical transmitter circuit according to the ninth embodiment of the present invention, it is possible to automatically adjust the amount of clipping so that the ratio of the clipping current amount with respect to the peaking current amount is less than or equal to a predetermined value, according both to the transmission speed and to the amplitude of the digital signal S based on the distance to the communication unit over which signals are transmitted, thus arriving at the minimum amount of clipping required for the transmission speed and the amplitude. Thus, it is possible to realize a high response speed of the light emitting element 5 while reducing the power consumption.

Figure 19:
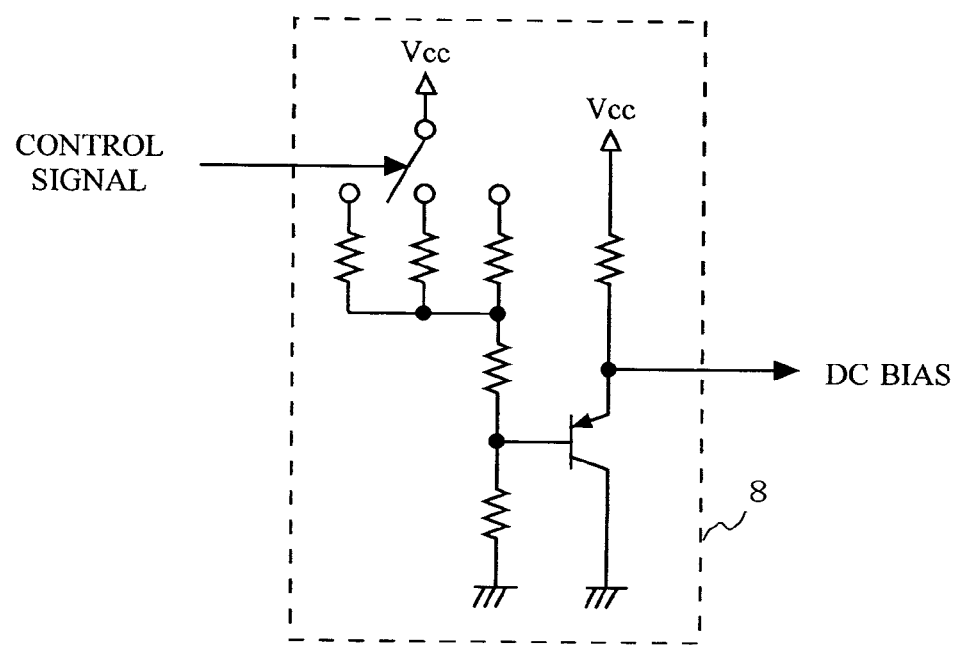
FIG. 19 is another detailed circuit diagram of a clipping section 8.
Figure 20:
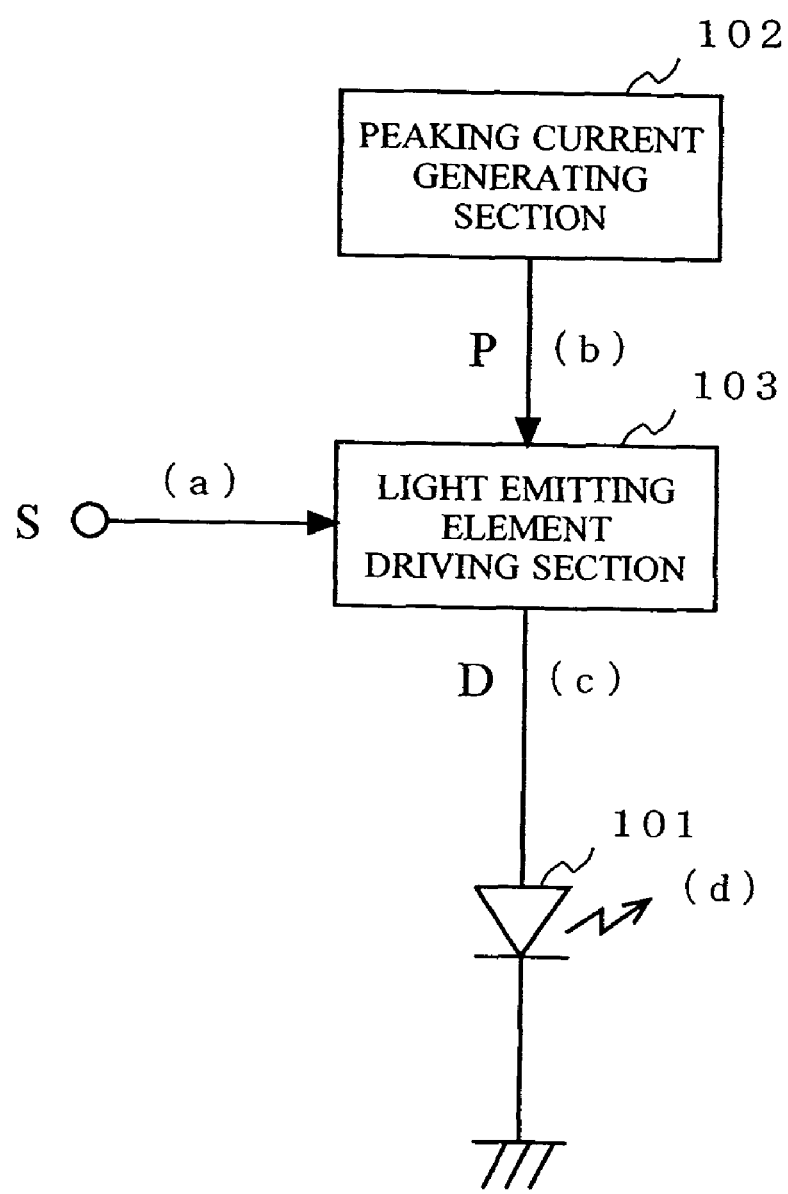
FIG. 20 is a functional block diagram showing a general configuration of a conventional light emitting element driving circuit.
Figure 21:
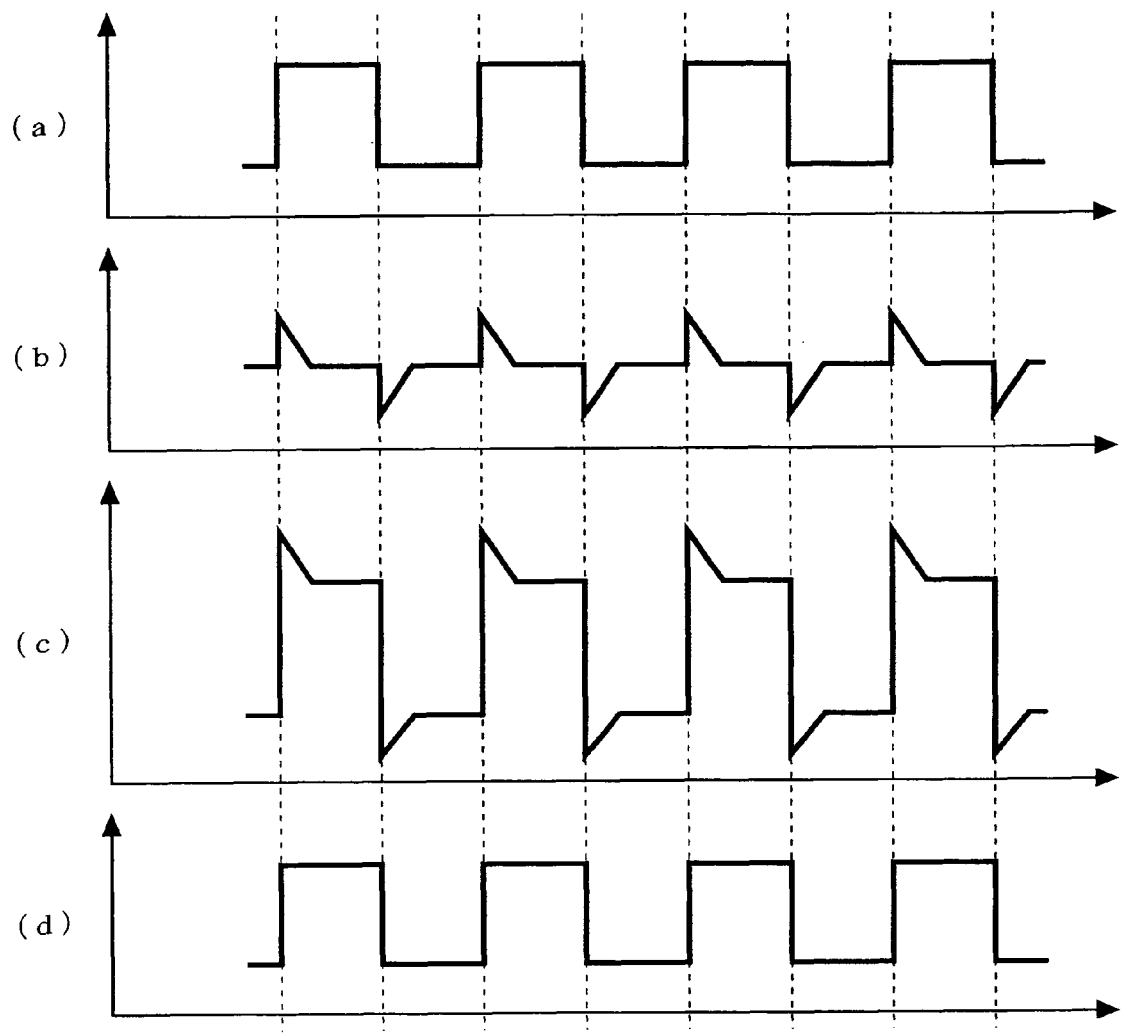
FIG. 21 shows waveform diagrams illustrating an operation of the light emitting element driving circuit shown in FIG. 20.
Figure 22:
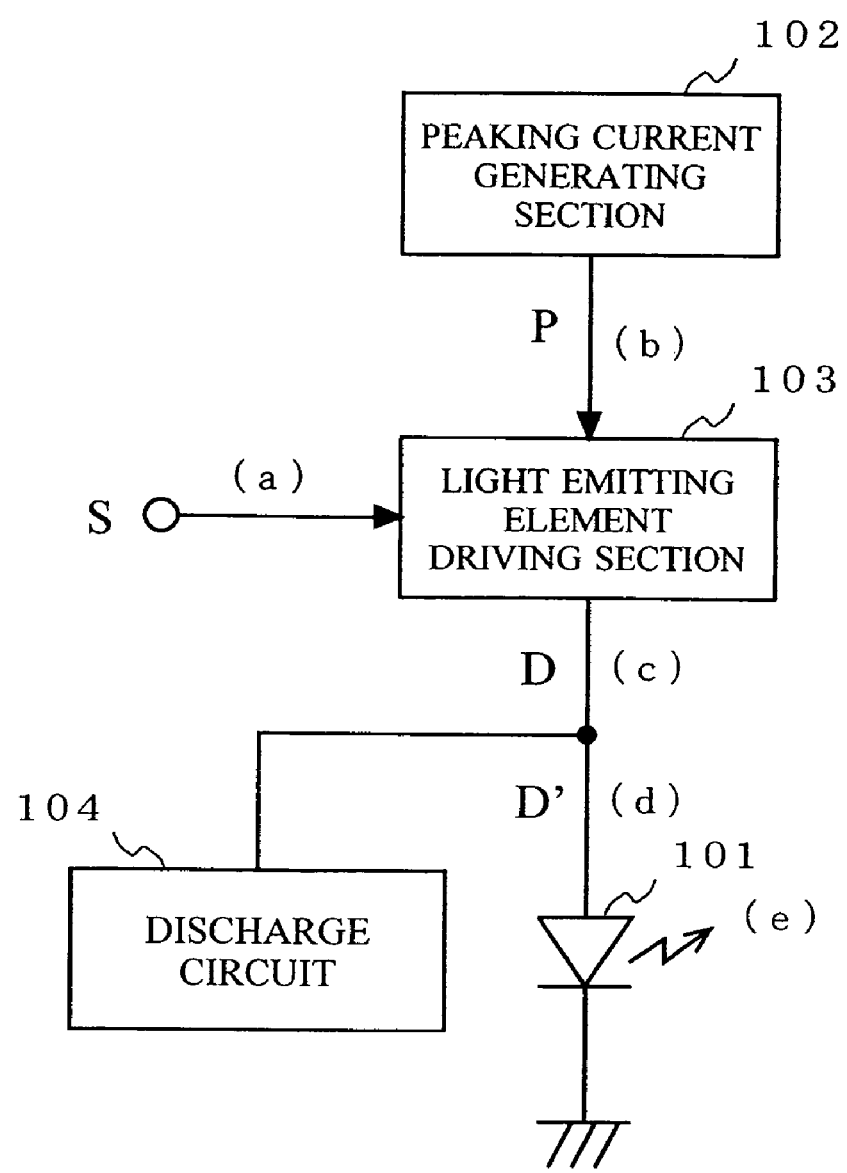
FIG. 22 is a functional block diagram showing a general configuration of another conventional light emitting element driving circuit.
Figure 23:
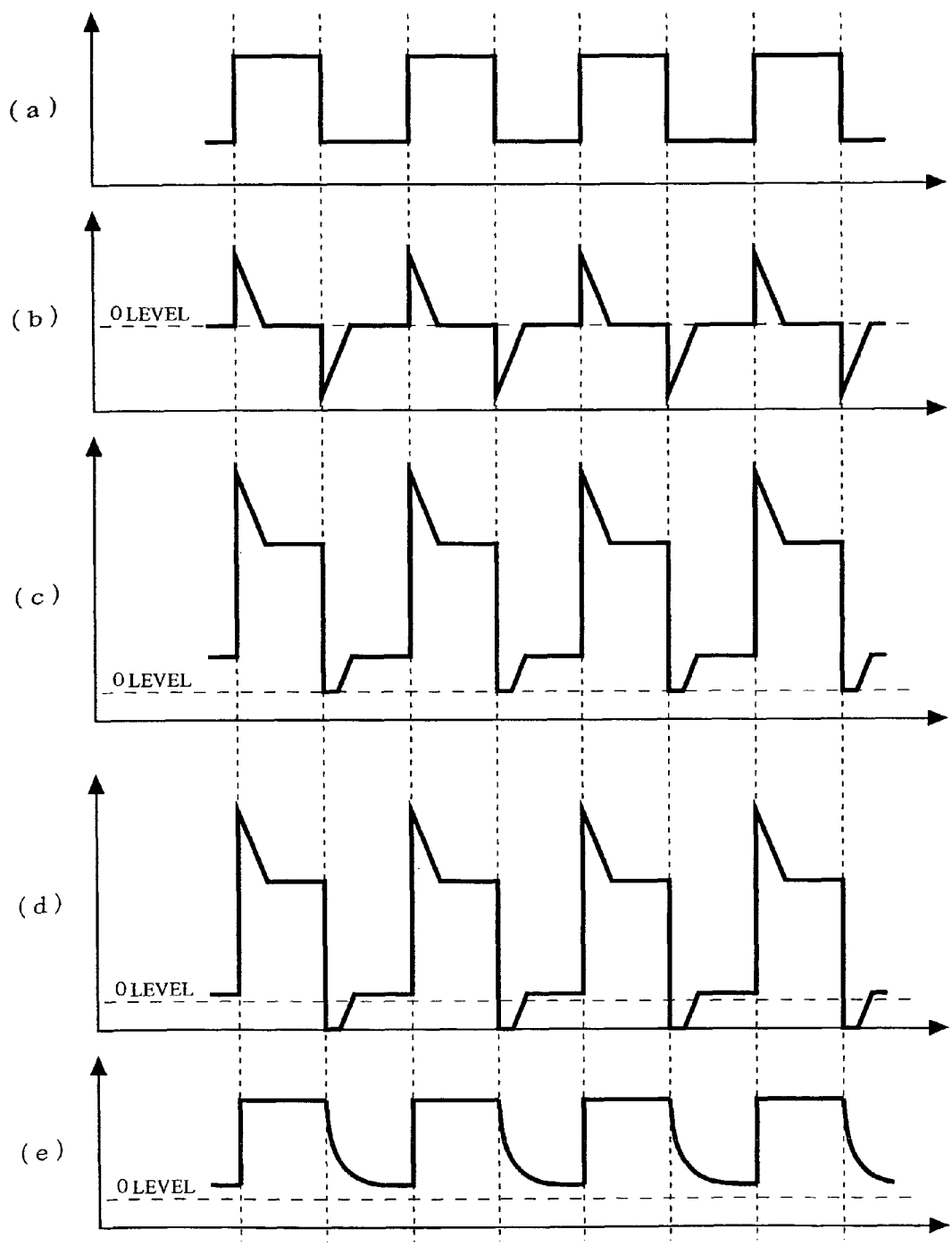
FIG. 23 shows waveform diagrams illustrating an operation of the light emitting element driving circuit shown in FIG. 22.

It is understood that particular circuits of the first to ninth embodiments using resistors, capacitors and transistors are all illustrative, and each of them may be replaced by any other suitable circuit as long as the same function is provided. For example, in the clipping section 8, the variable resistor R20 may be replaced by a combination of a plurality of resistors of different resistance values and a selector switch, as shown in FIG. 19. If the input digital signal S is static, the resistance value of the variable resistor R20 may be fixed without detecting the pulse width or the amplitude of the digital signal S.

In the first to fourth embodiments, the emitter of the transistor Q2 of the first light emitting element driving section 2 is grounded via the first peaking current generating section 1, and the emitter of the transistor Q1 of the second light emitting element driving section 4 is connected to the power supply VCC via the second peaking current generating section 3. Alternatively, the emitter of the transistor Q2 may be connected to the power supply VCC, with the emitter of the transistor Q1 being grounded. While the power supply VCC and the ground level are used as the upper limit voltage and the lower limit voltage, respectively, in the embodiments above, the lower limit voltage may be a negative-voltage power supply.

In the first to fourth embodiments, a peaking current is generated by each of the first and second peaking current generating sections, and the rising speed and the falling speed are both compensated for. However, the present invention is advantageous over conventional configurations even when only the falling speed is compensated for by using the first peaking current generating section.

While the invention has been described in detail, the foregoing description is in all aspects illustrative and not restrictive. It is understood that numerous other modifications and variations can be devised without departing from the scope of the invention.

What is claimed is:

1. An optical transmitter circuit for driving a light emitting element according to a received digital signal, the optical transmitter circuit comprising:
   a peaking current generating section for generating a peaking current in synchronism with a rising edge and a falling edge of the digital signal;
   a light emitting element driving section for producing a driving current obtained by combining together a signal amplitude current according to an amplitude of the digital signal and the peaking current, so as to drive the light emitting element by using the driving current;
   a signal analysis section for analyzing the digital signal so as to set a control signal based on at least one of a pulse width and the amplitude of the digital signal; and
   a clipping section for clipping the peaking current of the driving current according to the control signal set by the signal analysis section,
   wherein the clipping section sets a ratio of a clipping current amount with respect to the peaking current amount to be less than or equal to a predetermined value.

2. The optical transmitter circuit according to claim 1, wherein the signal analysis section includes:
   a pulse width detection section for detecting a pulse width of the digital signal; and
   a pulse width control section for setting a control signal according to the detected pulse width.

3. The optical transmitter circuit according to claim 1, wherein the signal analysis section includes:
   an amplitude detection section for detecting the amplitude of the digital signal; and
   an amplitude control section for setting a control signal according to the detected amplitude.

4. The optical transmitter circuit according to claim 1, wherein the signal analysis section includes:
   a pulse width detection section for detecting a pulse width of the digital signal;
   a pulse width control section for outputting a signal according to the detected pulse width;
   an amplitude detection section for detecting the amplitude of the digital signal;
   an amplitude control section for outputting a signal according to the detected amplitude; and
   a process section for setting, as a control signal, a signal obtained by adding together the signal outputted from the pulse width control section and the signal outputted from the amplitude control section.

5. The optical transmitter circuit according to claim 4, wherein the signal analysis section further includes:
   a light receiving element for receiving an optical signal transmitted from a communication unit with which the optical transmitter circuit is communicating;
   an amplifier section for amplifying the signal received by the light receiving element;
   a signal detection section for detecting the amplitude of the signal amplified by the amplifier section; and
   an amplitude control section for controlling the amplitude of the digital signal inputted to the pulse width detection section based on a detection result of the signal detection section.

6. The optical transmitter circuit according to claim 4, wherein the signal analysis section further includes:
- a light receiving element for receiving an optical signal transmitted from a communication unit with which the optical transmitter circuit is communicating;
- an amplifier section for amplifying the signal received by the light receiving element; and
- a signal detection section for detecting the amplitude of the signal amplified by the amplifier section,
- wherein the peaking current generating section controls an amount of peaking current to be generated based on a detection result of the signal detection section.

7. The optical transmitter circuit according to claim 1, wherein the peaking current generating section includes a first resistor and a second resistor connected in series with each other, and a capacitor connected in parallel to the first resistor.

8. The optical transmitter circuit according to claim 6, wherein the peaking current generating section includes a plurality of blocks, each block including a first resistor and a second resistor connected in series with each other, and a capacitor connected in parallel to the first resistor, and the blocks are switched from one to another based on a detection result of the signal detection section.

9. The optical transmitter circuit according to claim 1, wherein a predetermined value a2/a1, being a ratio of a clipping current amount a2 with respect to a peaking current amount a1, is determined as shown in the following expression, using constants A1, A2, N1 and N2 and a fall time tf, based on a fall time of a pulse that includes a time constant $\tau 1$ determined by the peaking current generating section and is determined by the peaking current and a fall time of a pulse that includes a time constant $\tau 2$ determined by the light emitting element driving section and the light emitting element and is determined by the clipping current.

$$tf = -A_1 \cdot \tau_1 \cdot \ln\left\{1 - N_1\left(1 - \frac{a_2}{a_1}\right)\right\} - A_2 \cdot \tau_2 \cdot \ln\left(1 - N_2 \cdot \frac{a_2}{a_1}\right)$$

10. The optical transmitter circuit according to claim 9, wherein the clipping section determines the predetermined value a2/a1 so as to satisfy 0<a2/a1<0.8 in a case where the light emitting element is driven at a transmission speed of about 500 Mbps.

11. The optical transmitter circuit according to claim 1, wherein the light emitting element is provided within the optical transmitter circuit.

12. The optical transmitter circuit according to claim 1, wherein the light emitting element is an LED.

* * * * *